United States Patent
Ikeda et al.

(10) Patent No.: US 11,119,117 B2
(45) Date of Patent: Sep. 14, 2021

(54) SENSOR

(71) Applicant: Sumitomo Precision Products Co., Ltd., Amagasaki (JP)

(72) Inventors: Takashi Ikeda, Amagasaki (JP); Hiroshi Tanaka, Amagasaki (JP); Mario Kiuchi, Amagasaki (JP)

(73) Assignee: Sumitomo Precision Products Co., Ltd., Amagasaki (JP)

( * ) Notice: Subject to any disclaimer, the term of this patent is extended or adjusted under 35 U.S.C. 154(b) by 227 days.

(21) Appl. No.: 16/333,738

(22) PCT Filed: Sep. 13, 2017

(86) PCT No.: PCT/JP2017/033139
§ 371 (c)(1),
(2) Date: Mar. 15, 2019

(87) PCT Pub. No.: WO2018/056147
PCT Pub. Date: Mar. 29, 2018

(65) Prior Publication Data
US 2019/0277879 A1  Sep. 12, 2019

(30) Foreign Application Priority Data

Sep. 23, 2016  (JP) .............................. JP2016-186285

(51) Int. Cl.
*G01P 15/135* (2006.01)
*B81B 7/02* (2006.01)
(Continued)

(52) U.S. Cl.
CPC .............. *G01P 15/135* (2013.01); *B81B 7/02* (2013.01); *G01P 15/08* (2013.01); *G01P 15/09* (2013.01);
(Continued)

(58) Field of Classification Search
CPC ...... G01P 15/18; G01P 15/135; G01P 15/125; G01P 15/09; G01P 15/08; B81B 7/02
(Continued)

(56) References Cited

U.S. PATENT DOCUMENTS

| 7,227,245 B1 * | 6/2007 | Bayan ............... H01L 23/49548 |
| | | 257/666 |
| 9,000,543 B2 * | 4/2015 | Jeong ................... G01C 19/574 |
| | | 257/415 |

(Continued)

FOREIGN PATENT DOCUMENTS

JP      2014-534419 A     12/2014

OTHER PUBLICATIONS

International Search Report (PCT/ISA/210) issued in PCT Application No. PCT/JP2017/033139 dated Dec. 5, 2017 with English translation (five (5) pages).
(Continued)

*Primary Examiner* — John Fitzgerald
*Assistant Examiner* — Jean F Morello
(74) *Attorney, Agent, or Firm* — Crowell & Moring LLP

(57) ABSTRACT

This accelerometer (100) includes a substrate (30) and a bonding member (90) that bonds the substrate (30) and a supporting member (50) to each other, and the bonding member (90) is arranged in a region (R3) that straddles a first region (R1) in which a first sensor element (11) is arranged and a second region (R2) in which a second sensor element (12) is arranged in a plan view.

9 Claims, 11 Drawing Sheets

(51) Int. Cl.
    *G01P 15/125*     (2006.01)
    *G01P 15/18*     (2013.01)
    *G01P 15/09*     (2006.01)
    *G01P 15/08*     (2006.01)

(52) U.S. Cl.
    CPC ............ G01P 15/125 (2013.01); G01P 15/18 (2013.01); *B81B 2201/0235* (2013.01); *G01P 2015/0857* (2013.01)

(58) Field of Classification Search
    USPC ........................... 73/514.36, 514.01, 514.32
    See application file for complete search history.

(56) References Cited

U.S. PATENT DOCUMENTS

| | | | |
|---|---|---|---|
| 9,343,367 B2* | 5/2016 | Goida | H01L 23/562 |
| 9,476,907 B2 | 10/2016 | Malvern et al. | |
| 10,287,161 B2* | 5/2019 | Xue | H01L 25/0652 |
| 2013/0247667 A1* | 9/2013 | Malvern | G01P 15/125 |
| | | | 73/514.32 |
| 2015/0208507 A1* | 7/2015 | Walmsley | G01P 15/0802 |
| | | | 361/783 |
| 2017/0074896 A1* | 3/2017 | Tanaka | G01P 15/125 |

OTHER PUBLICATIONS

Japanese-language Written Opinion (PCT/ISA/237) issued in PCT Application No. PCT/JP2017/033139 dated Dec. 5, 2017 (three (3) pages).

\* cited by examiner

SENSOR

TECHNICAL FIELD

The present invention relates to a sensor, and more particularly, it relates to a sensor that outputs a differential value between a value detected by a first sensor element and a value detected by a second sensor element.

BACKGROUND ART

In general, a sensor that outputs a differential value between a value detected by a first sensor element and a value detected by a second sensor element is known. Such a sensor is disclosed in Japanese Translation of PCT International Application Publication No. 2014-534419, for example.

In the aforementioned Japanese Translation of PCT International Application Publication No. 2014-534419, there is disclosed an accelerometer including upper groups and lower groups. The upper groups and the lower groups include fixed fingers and movable fingers. The upper groups and the lower groups are arranged on the same substrate. This accelerometer detects a difference between the capacitance of the upper groups and the capacitance of the lower groups and outputs an output value that corresponds to acceleration applied to the accelerometer.

In the conventional accelerometer described in the aforementioned Japanese Translation of PCT International Application Publication No. 2014-534419, the substrate is arranged on a support member that supports the substrate. The substrate and the support member are bonded to each other by a bond provided over an entire surface of the substrate closer to the support member.

PRIOR ART

Patent Document

Patent Document 1: Japanese Translation of PCT International
Application Publication No. 2014-534419

SUMMARY OF THE INVENTION

Problem to be Solved by the Invention

In the conventional accelerometer described in the aforementioned Japanese Translation of PCT International Application Publication No. 2014-534419, however, dissimilar materials (the substrate and the support member) having coefficients of thermal expansion different from each other are bonded to each other, and hence a variation (such as a bias or drift) is generated in the output value of the accelerometer due to distortion transmitted from one side (support member) to the other side (substrate). Therefore, its performance as the accelerometer (sensor) is decreased due to bonding of the dissimilar materials to each other, which have the coefficients of thermal expansion different from each other, to each other.

The present invention has been proposed in order to solve the aforementioned problem, and an object of the present invention is to provide a sensor capable of significantly reducing or preventing a decrease in its performance as a sensor due to bonding of a substrate and a supporting member to each other.

Means for Solving the Problem

In order to attain the aforementioned object, a sensor according to an aspect of the present invention is a sensor that outputs a differential value between a value detected by a first sensor element and a value detected by a second sensor element provided separately from the first sensor element, and includes a substrate on which the first sensor element and the second sensor element are arranged, a supporting member that supports the substrate, and a bonding member that is provided between the substrate and the supporting member and bonds the substrate and the supporting member to each other, and the bonding member is arranged in a region that is smaller than the substrate and straddles a first region of the substrate in which the first sensor element is arranged and a second region of the substrate in which the second sensor element is arranged in a plan view.

In the sensor according to this aspect of the present invention, as hereinabove described, the bonding member is arranged in the region that is smaller than the substrate and straddles the first region of the substrate in which the first sensor element is arranged and the second region of the substrate in which the second sensor element is arranged in the plan view. Thus, as compared with the case where the bonding member is arranged in an entire region of the substrate in the plan view, the region in which the bonding member is arranged is reduced in size, and hence a decrease in performance as the sensor caused by distortion (thermal expansion distortion) transmitted from the supporting member to the substrate through the bonding member can be significantly reduced or prevented. Furthermore, the bonding member is arranged in the region that straddles the first region and the second region in the plan view such that the influence of the thermal expansion distortion on the value detected by the first sensor element and the influence of the thermal expansion distortion on the value detected by the second sensor element cancel each other out in the differential value between the value detected by the first sensor element and the value detected by the second sensor element, and hence a decrease in performance as the sensor due to bonding of dissimilar materials (the substrate and the supporting member) to each other can be further significantly reduced or prevented.

In the aforementioned sensor according to this aspect, the bonding member preferably includes a pedestal and an adhesion layer arranged on a surface of the pedestal. If the bonding member includes only a resin adhesive, a variation in the region in which the bonding member is generated due to a variation in the amount of the resin adhesive or a variation in the shape (deformation) of the resin adhesive at the time of application of the resin adhesive. Therefore, a variation in the performance of the sensor may be generated due to a variation in the region in which the bonding member is arranged. On the other hand, according to the present invention, the bonding member includes the pedestal and the adhesion layer arranged on the surface of the pedestal. Thus, unlike the resin adhesive, a change in the shape of the pedestal at the time of arrangement is small such that a variation in the shape is reduced, and hence a variation in the shape of the bonding member can be significantly reduced or prevented. Furthermore, the pedestal is provided, and hence the thickness (amount) of the adhesion layer can be reduced, as compared with the case where the bonding member includes only the resin adhesive. Thus, variations in the amount and shape of the adhesion layer can be significantly reduced or prevented. Consequently, a variation in the performance of the sensor can be significantly reduced or prevented.

In this case, a thickness of the adhesion layer is preferably less than a thickness of the pedestal. According to this structure, the thickness of the adhesion layer can be further reduced, and hence variations in the amount and shape of the adhesion layer can be further significantly reduced or prevented.

In the aforementioned sensor including the bonding member that includes the adhesion layer arranged on the surface of the pedestal, the adhesion layer preferably includes one of an epoxy resin having a viscosity of not more than 30 Pa·s and an acrylic resin having a viscosity of not more than 30 Pa·s. If the bonding member includes a silicone resin having a relatively high viscosity (more than 30 Pa·s), due to the high viscosity, the application amount may not be easily adjusted, or the wettability is reduced such that a variation in an application region may become large. The stress inflection point of the silicone resin is within a range from −30° C. to −10° C. The operating temperature range of a common sensor is from −40° C. to 125° C., for example. When the sensor is used within this operating temperature range, the stress characteristics of the silicone resin are changed such that the performance of the sensor may be decreased. On the other hand, according to the present invention, the adhesion layer includes one of the epoxy resin having a viscosity of not more than 30 Pa·s and the acrylic resin having a viscosity of not more than 30 Pa·s. Thus, the viscosity of the adhesion layer can be reduced, and hence the application amount can be easily adjusted. Furthermore, the adhesion layer can be arranged to wet out on the pedestal, and hence a variation in the application region can be reduced to the degree of a variation in the shape of the pedestal having a relatively small shape variation. In addition, the glass transition point (a point at which the stress characteristics are changed) of the epoxy resin is a temperature (about 158° C.) exceeding 125° C., and is out of the above operating temperature range. Consequently, unlike the case where the silicone resin is used, a change in the stress characteristics of the bonding member within the operating temperature range can be significantly reduced or prevented.

In the aforementioned sensor including the bonding member that includes the adhesion layer arranged on the surface of the pedestal, the pedestal preferably includes a same material as a constituent material of the substrate. According to this structure, the coefficient of linear expansion of the material included in the pedestal and the coefficient of linear expansion of the constituent material of the substrate can be substantially equal to each other, and hence the thermal expansion distortion of the bonding member due to different coefficients of linear expansion can be effectively significantly reduced or prevented.

In the aforementioned sensor according to this aspect, the bonding member preferably has a substantially circular shape in a plan view. If the bonding member has a shape having corners, such as a rectangular shape, in the plan view, stress concentration easily occurs in these corners. In consideration of this point, according to the present invention, the bonding member has the substantially circular shape in the plan view, and hence stress concentration can be significantly reduced or prevented due to no corner in the bonding member.

In the aforementioned sensor according to this aspect, the bonding member is preferably line-symmetric about a line segment that passes through an intermediate point between the first region and the second region and is orthogonal to a direction in which the first sensor element and the second sensor element are arrayed in a plan view. According to this structure, a portion of the bonding member arranged in the first region and a portion of the bonding member arranged in the second region are line-symmetric with each other, and hence the influence of distortion transmitted to the first sensor element and the influence of distortion transmitted to the second sensor element can be made more equal to each other.

In this case, the first sensor element preferably includes a first fixed part to secure the first sensor element to the substrate, the second sensor element preferably includes a second fixed part to secure the second sensor element to the substrate, being line-symmetric with the first fixed part about a line segment, and the bonding member is preferably arranged in a region that includes an intermediate point between the first fixed part and the second fixed part and straddles the first region and the second region in a plan view. Thermal expansion distortion is transmitted to the first fixed part of the first sensor element and the second fixed part of the second sensor element through the substrate. In view of this point, according to the present invention, the sensor is configured as described above, whereby the influence of the distortion (thermal expansion distortion) transmitted to the first fixed part and the influence of the distortion transmitted to the second fixed part can be made equal to each other. Consequently, the influence of the distortion transmitted to the first sensor element and the influence of the distortion transmitted to the second sensor element can be more reliably made equal to each other.

In the aforementioned sensor according to this aspect, the first sensor element and the second sensor element are preferably configured as a MEMS, and each preferably include a first comb electrode having a first fixed electrode finger and a first movable electrode finger. According to this structure, acceleration can be detected by the first comb electrode. It is particularly effective to apply the present invention capable of significantly reducing or preventing a decrease in its performance as the sensor due to distortion to a MEMS sensor that includes the first comb electrode and is easily influenced by the distortion (thermal expansion distortion). In this description, the MEMS denotes a micro electro mechanical system.

In this case, the first sensor element and the second sensor element are preferably arranged in a portion of the substrate on a first side in a longitudinal direction, the sensor preferably further includes a third sensor element including a second comb electrode having a second fixed electrode finger and a second movable electrode finger, arranged in a portion of the substrate on a second side in the longitudinal direction, the first fixed electrode finger and the first movable electrode finger of the first comb electrode preferably extend along the longitudinal direction of the substrate, the second fixed electrode finger and the second movable electrode finger of the second comb electrode preferably extend along a short-side direction of the substrate, and the portion of the substrate on the first side in the longitudinal direction and the supporting member are preferably bonded to each other through the bonding member while the portion of the substrate on the second side in the longitudinal direction and the supporting member are spaced apart from each other without the bonding member.

When a stress is applied to a substrate due to the thermal expansion of a supporting member, a portion (a portion of the substrate on a first side in a longitudinal direction) bonded by a bonding member is restrained by the bonding member to be curved by the thermal expansion distortion of the supporting member transmitted to the substrate through the bonding member whereas a portion (a portion of the substrate on a second side in the longitudinal direction) other than the portion bonded by the bonding member is substantially linearly deformed (inclined) (see FIG. 21), as viewed from a first side in the short-side direction of the substrate. Therefore, when first comb electrodes of a first sensor element (a reference numeral 1221 in FIG. 20, for example) and a second sensor element (a reference numeral 1222 in FIG. 20, for example) extend along the short-side direction of the substrate, an interval between a first fixed electrode finger and a first movable electrode finger is changed with the curvature, and this causes the bias or drift of detected values. When the supporting member is heat shrunk, the bonding member and the portion of the substrate restrained by the bonding member are curved in a direction opposite to a direction shown in FIG. 21, and the portion other than the portion bonded by the bonding member is substantially linearly deformed (inclined) toward an arrow Z2 direction side in FIG. 21.

In consideration of this point, according to the present invention, the first comb electrodes of the first sensor element and the second sensor element extend along the longitudinal direction of the substrate. Thus, even when the substrate is curved while the portion of the substrate in which the third sensor element is arranged is inclined, an interval between the first fixed electrode finger and the first movable electrode finger is not changed, and hence a decrease in the performance of the first sensor element and the second sensor element can be significantly reduced or prevented. While the third sensor element includes the second comb electrode that extends along the short-side direction of the substrate, according to the present invention, the third sensor element is arranged on the portion of the substrate spaced apart from the supporting member without the bonding member. Thus, even when a stress is applied to the substrate due to the thermal expansion of the supporting member, the portion of the substrate in which the third sensor element is arranged (the portion of the substrate on the second side in the longitudinal direction) is substantially linearly deformed (inclined), and hence an interval between the second fixed electrode finger and the second movable electrode finger is not changed. Consequently, a decrease in the performance of the third sensor element can be significantly reduced or prevented. Therefore, detected values in two axial directions can be acquired while a decrease in the performance of the first sensor element, the second sensor element, and the third sensor element is significantly reduced or prevented.

In the aforementioned sensor including the first fixed electrode finger and the first movable electrode finger that are arranged on the portion of the substrate on the first side in the longitudinal direction and extend along the longitudinal direction of the substrate, the first sensor element and the second sensor element are preferably arrayed in parallel to each other in the short-side direction of the substrate in the portion of the substrate on the first side in the longitudinal direction.

When the first sensor element and the second sensor element are arranged on the portion of the substrate on the first side in the longitudinal direction, a difference is generated between a distance from a position (hereinafter referred to as a "restraint position") at which the substrate is restrained by the bonding member to the center of gravity of the portion of the substrate on the first side in the longitudinal direction and a distance from the restraint position to the center of gravity of the portion of the substrate on the second side in the longitudinal direction, for example. Thus, due to this difference in distance, a difference is generated between the magnitude of a moment applied from the first side in the longitudinal direction to the region of the substrate in which the bonding member is arranged and the magnitude of a moment applied from the second side in the longitudinal direction to the region of the substrate in which the bonding member is arranged. Consequently, also in the region of the substrate in which the bonding member is arranged, a difference is generated between the magnitude of distortion on the first side in the longitudinal direction and the magnitude of distortion on the second side in the longitudinal direction (the amount of deformation in the interval between the first fixed electrode finger and the first movable electrode finger).

When the first sensor element and the second sensor element are arranged in parallel to each other in the longitudinal direction, as shown in FIGS. 20 and 22, a difference is generated between the amount of deformation (distortion) on the first side (closer to the first sensor element, for example) in the longitudinal direction and the amount of deformation (distortion) on the second side (closer to the second sensor element, for example) in the longitudinal direction in the region of the substrate in which the bonding member is arranged. Thus, this difference in the amount of deformation is not canceled out even when a differential value between the value detected by the first sensor element and the value detected by the second sensor element is acquired.

When the first sensor element and the second sensor element each including the first fixed electrode finger and the first movable electrode finger that extend along the longitudinal direction of the substrate are arranged in parallel to each other in the longitudinal direction, as shown in FIG. 22, the position of a detection axis of the first sensor element and the position of a detection axis of the second sensor element are deviated from each other (two axes are formed) in the longitudinal direction, and hence the detection accuracy may be reduced due to this deviation of the detection axes.

On the other hand, according to the present invention, the first sensor element and the second sensor element are arrayed in parallel to each other in the short-side direction of the substrate on the portion of the substrate on the first side in the longitudinal direction. Thus, even when a difference is generated between the magnitude of distortion on the first side in the longitudinal direction and the magnitude of distortion on the second side in the longitudinal direction in the region of the substrate in which the bonding member is arranged, the differential value between the values detected by the first sensor element and the second sensor element arrayed in parallel to each other in the short-side direction of the substrate is acquired such that the influence of the distortion on the first side in the longitudinal direction and the influence of the distortion on the second side in the longitudinal direction cancel each other out, and hence a decrease in performance as the sensor can be significantly reduced or prevented. Furthermore, the position of the detection axis of the first sensor element and the position of the detection axis of the second sensor element can coincide with each other (one axis can be formed), and hence the detection accuracy can be improved.

Effect of the Invention

According to the present invention, as hereinabove described, a decrease in performance as the sensor due to bonding of the substrate and the supporting member to each other can be significantly reduced or prevented.

MODES FOR CARRYING OUT THE INVENTION

An embodiment of the present invention is hereinafter described on the basis of the drawings.

[Structure According to this Embodiment]

The structure of an accelerometer 100 according to this embodiment is now described with reference to FIGS. 1 to 7.

According to this embodiment, the accelerometer 100 is configured as an electronic component capable of detecting accelerations in two axial directions (a direction along an X-axis and a direction along a Y-axis).

(Overall Structure of Accelerometer)

Figure 1:
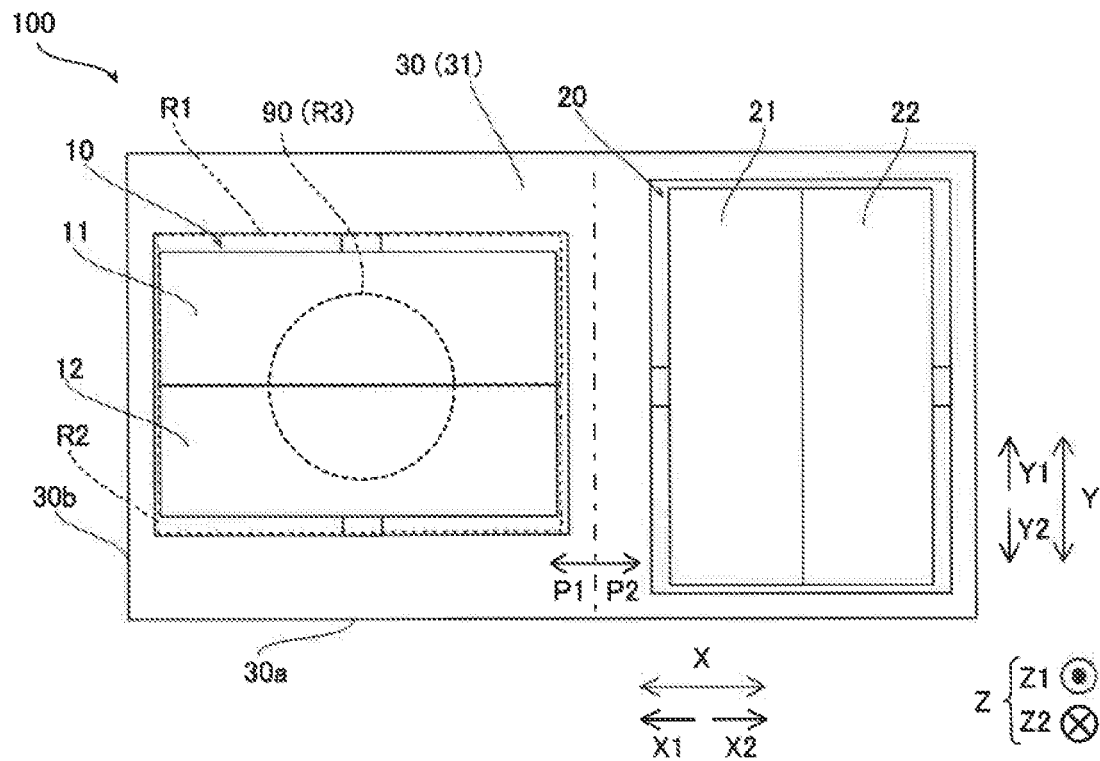
FIG. 1 A plan view showing the partial structure of an accelerometer according to an embodiment of the present invention.

As shown in FIG. 1, the accelerometer 100 includes a Y-axis sensor element 10 and an X-axis sensor element 20 as inertial sensors of a MEMS. In this description, the MEMS denotes a micro electro mechanical system. The X-axis sensor element 20 is an example of a "third sensor element" in the claims.

The Y-axis sensor element 10 includes a first Y-axis sensor element 11 and a second Y-axis sensor element 12 provided separately from the first Y-axis sensor element 11 and arranged on the arrow Y2 direction side of the first Y-axis sensor element 11. The first Y-axis sensor element 11 and the second Y-axis sensor element 12 each detect acceleration in the direction along the Y-axis (hereinafter referred to as the Y-axis direction). The first Y-axis sensor element 11 is an example of a "first sensor element" in the claims. The second Y-axis sensor element 12 is an example of a "second sensor element" in the claims.

The X-axis sensor element 20 includes a first X-axis sensor element 21 and a second X-axis sensor element 22 provided separately from the first X-axis sensor element 21 and arranged on the arrow X2 direction side of the first X-axis sensor element 21. The first X-axis sensor element 21 and the second X-axis sensor element 22 each detect acceleration in the direction along the X-axis (hereinafter referred to as the X-axis direction).

The accelerometer 100 further includes a substrate 30. As viewed from an arrow Z1 direction side (in a plan view), the Y-axis sensor element 10 is arranged on a portion P1, which is a portion of the substrate 30 on an arrow X1 direction side, and the X-axis sensor element 20 is arranged on a portion P2, which is a portion of the substrate 30 on the arrow X2 direction side.

Figure 2:
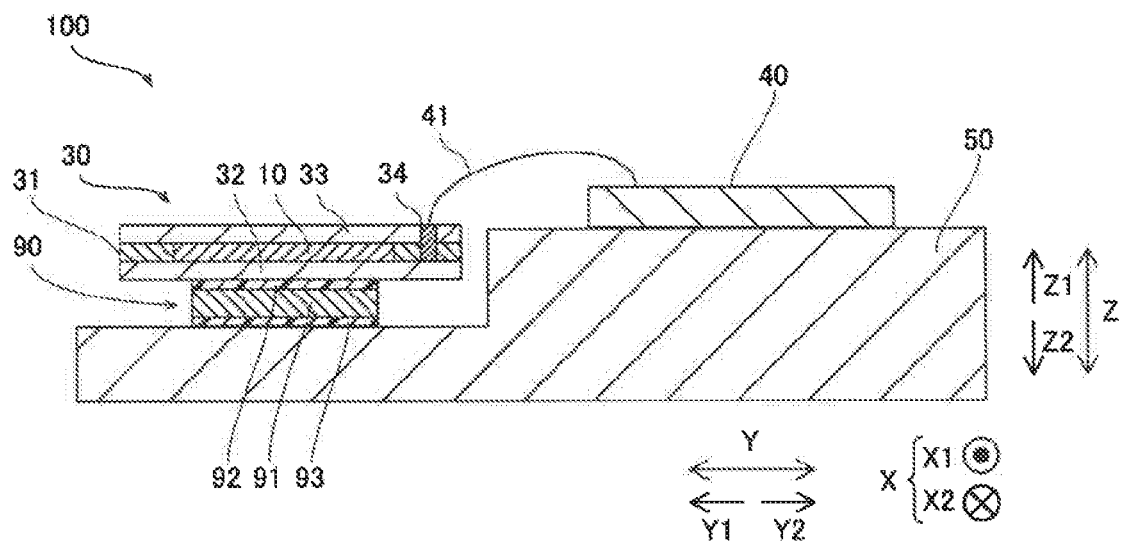
FIG. 2 A sectional view schematically showing the structure of the accelerometer according to the embodiment of the present invention.

As shown in FIG. 2, the accelerometer 100 further includes a control circuit 40 and a package base 50. The package base 50 supports the substrate 30 and the control circuit 40. The control circuit 40 is spaced apart from the substrate 30, the Y-axis sensor element 10, and the X-axis sensor element 20. The control circuit 40 is connected to the Y-axis sensor element 10 and the X-axis sensor element 20 through a wire 41 made of gold. The package base 50 is an example of a "supporting member" in the claims.

According to this embodiment, the accelerometer 100 includes a bonding member 90 that is provided between the substrate 30 and the package base 50 and bonds the substrate 30 to the package base 50, as shown in FIGS. 1 and 2. The bonding member 90 is arranged in a region R3 that is smaller than the substrate 30 and straddles a first region R1 of the substrate 30 in which the first Y-axis sensor element 11 is arranged and a second region R2 of the substrate 30 in which the second Y-axis sensor element 12 is arranged in the plan view, as shown in FIG. 1. In other words, the region R3 overlaps the first region R1 and the second region R2 in the plan view.

As shown in FIG. 1, the first region R1, the second region R2, and the region R3 are regions of the substrate 30 that surround positions at which the first Y-axis sensor element 11, the second Y-axis sensor element 12, and the bonding member 90 are arranged (regions inside dotted lines in FIG. 1) in the plan view.

Figure 3:
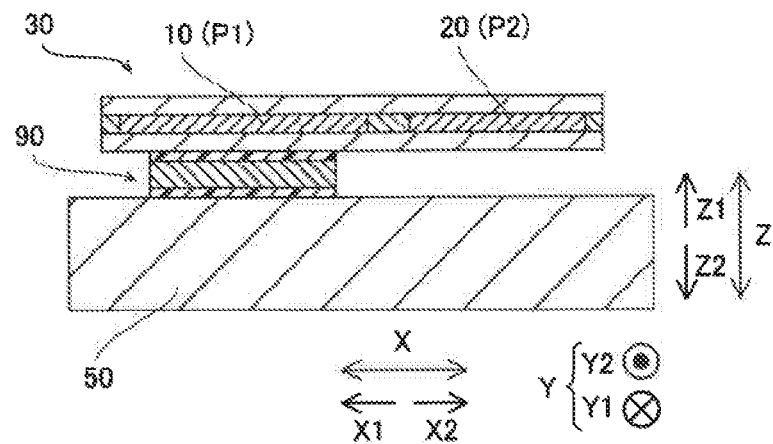
FIG. 3 Another sectional view schematically showing the structure of the accelerometer according to the embodiment of the present invention.

In other words, according to this embodiment, the portion P1 of the substrate 30 and the package base 50 are bonded to each other through the bonding member 90, and the portion P2 of the substrate 30 and the package base 50 are spaced apart from each other without the bonding member 90, as shown in FIG. 3.

(Structure of Substrate)

The substrate 30 has a three-layered structure, as shown in FIG. 2. Specifically, the substrate 30 includes a silicon layer 31 in which the Y-axis sensor element 10 and the X-axis sensor element 20 are arranged, a lower glass layer 32 arranged on the side (arrow Z2 direction side) of the silicon layer 31 closer to the package base 50, and an upper glass layer 33 arranged on the arrow Z1 direction side of the silicon layer 31.

More specifically, the lower glass layer 32 and the upper glass layer 33 are arranged to sandwich the silicon layer 31 therebetween. As shown in FIG. 1, the silicon layer 31 has a frame shape that surrounds each of the Y-axis sensor element 10 and the X-axis sensor element 20 in the plan view. At least a portion (a frame-shaped portion, for example) of a boundary between the lower glass layer 32 and the silicon layer 31 and at least a portion (a frame-shaped portion, for example) of a boundary between the upper glass layer 33 and the silicon layer 31 are bonded to each other by anodic bonding.

The lower glass layer 32 and the upper glass layer 33 include borosilicate glass (specifically, Pyrex glass, Tempax glass, or the like), for example. The lower glass layer 32, the upper glass layer 33, and the silicon layer 31 each have a coefficient of linear expansion of at least 3 ppm/K and not more than 4 ppm/K.

As shown in FIG. 1, the substrate 30 has a substantially rectangular shape, as viewed from the arrow Z1 direction side. For example, the substrate 30 has a long side 30a that extends in a longitudinal direction in the X-axis direction and a short side 30b that extends in a short-side direction in the Y-axis direction. As viewed from the arrow Z1 direction side, the Y-axis sensor element 10 is arranged on the portion P1 of the substrate 30 on a first side in the longitudinal direction inside the frame-shaped silicon layer 31. As viewed from the arrow Z1 direction side, the X-axis sensor element 20 is arranged on the portion P2 of the substrate 30 on a second side in the longitudinal direction inside the silicon layer 31.

The Y-axis sensor element 10 and the X-axis sensor element 20 can be formed by etching silicon (bulk silicon) using a DRIE (deep reactive ion etch) technique, for example. In other words, the Y-axis sensor element 10 and the X-axis sensor element 20 include silicon.

The lower glass layer 32, the upper glass layer 33, and the silicon layer 31 are formed such that an internal space of the substrate 30 in which the Y-axis sensor element 10 and the X-axis sensor element 20 are arranged is sealed at atmospheric pressure. Specifically, the Y-axis sensor element 10 and the X-axis sensor element 20 are covered with the silicon layer 31 having a frame-shaped circumference and are sandwiched by the lower glass layer 32 and the upper glass layer 33 to be sealed, as shown in FIG. 1.

(Structures of Y-Axis Sensor Element and X-Axis Sensor Element)

Figure 4:
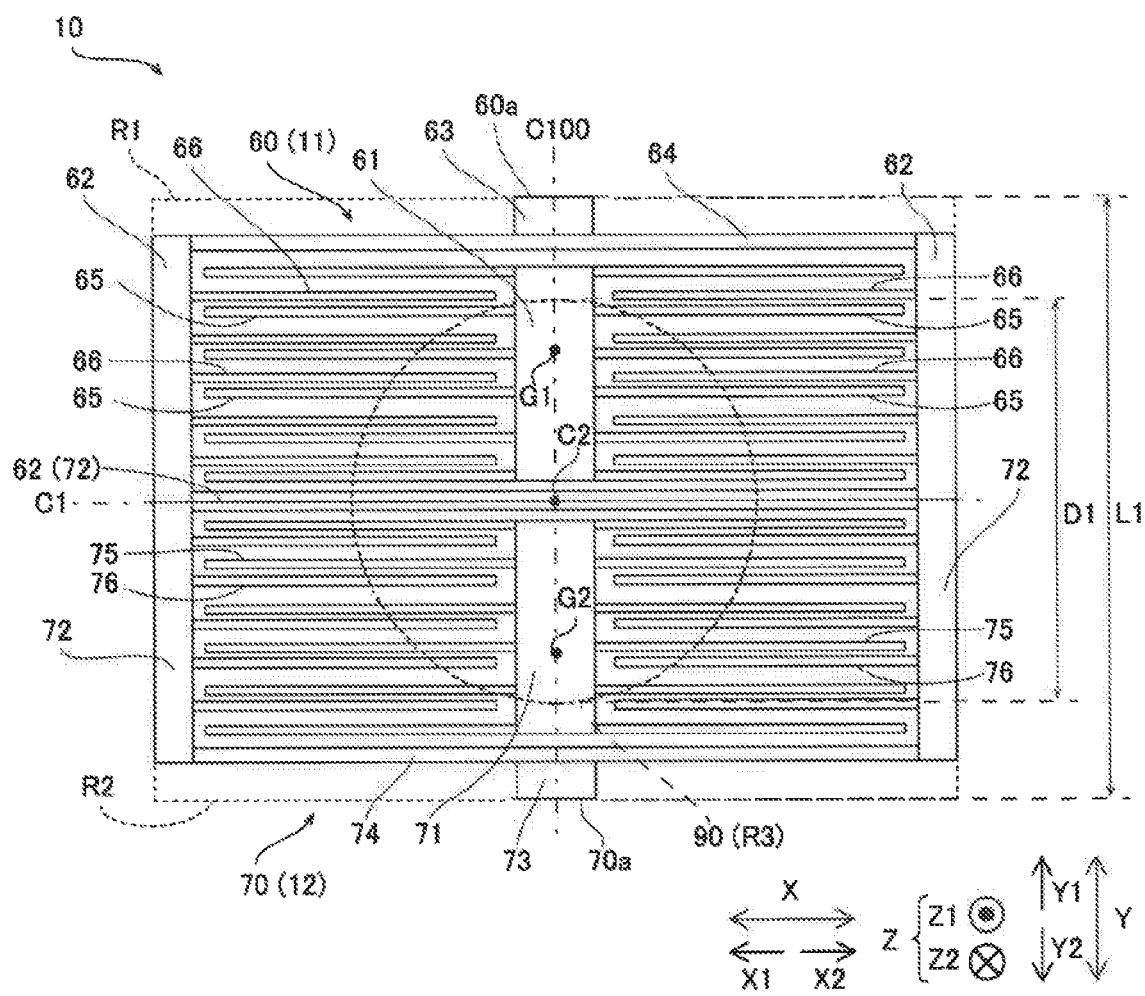
FIG. 4 A plan view showing the structure of a Y-axis sensor element of the accelerometer according to the embodiment of the present invention.

As shown in FIG. 4, the first Y-axis sensor element 11 includes a first Y-axis comb electrode 60. The first Y-axis comb electrode 60 is configured as a MEMS element, and includes a fixed electrode body 61, proof masses 62 (test masses), a support 63, and a mounting leg 64. According to this embodiment, the first Y-axis comb electrode 60 includes a plurality of fixed electrode fingers 65 and a plurality of movable electrode fingers 66. The first Y-axis sensor element 11 and the second Y-axis sensor element 12 have a common detection axis C100. The fixed electrode body 61 and the support 63 are examples of a "first fixed part" in the claims. The first Y-axis comb electrode 60 is an example of a "first comb electrode" in the claims. The fixed electrode fingers 65 are examples of a "first fixed electrode finger" in the claims. The movable electrode fingers 66 are examples of a "first movable electrode finger" in the claims.

Specifically, the plurality of (twelve in an example shown in FIG. 4) fixed electrode fingers 65 extend in a cantilever shape from the fixed electrode body 61 toward opposite sides in a direction along the longitudinal direction (X-axis direction) of the substrate 30. The plurality of (ten, for example) movable electrode fingers 66 extend in a cantilever shape from the proof masses 62 toward the fixed electrode body 61 in the direction along the longitudinal direction (X-axis direction) of the substrate 30. The plurality of fixed electrode fingers 65 and the plurality of movable electrode fingers 66 are arranged to mesh with each other in a state where clearances are formed in the Y-axis direction between the fixed electrode fingers 65 and the movable electrode fingers 66. Thus, the first Y-axis comb electrode 60 constitutes a capacitor. The fixed electrode fingers 65 are arranged closer to the movable electrode fingers 66 on the arrow Y2 direction side than the movable electrode fingers 66 on an arrow Y1 direction side of the movable electrode fingers 66 adjacent on both sides in the Y-axis direction. In FIG. 4, the plurality of fixed electrode fingers 65 and the plurality of movable electrode fingers 66 are partially denoted by the reference numerals.

The fixed electrode body 61 and the support 63 serve as a fixed part (anchor) to secure (mount) the first Y-axis sensor element 11 to the substrate 30. In other words, the fixed electrode body 61 and the support 63 are fixed to at least one of the lower glass layer 32 and the upper glass layer 33 by bonding (anodic bonding, for example). For example, the fixed electrode body 61 and the support 63 are arranged in parallel to each other in the Y-axis direction.

The support 63 is provided closer to an end 60a (on the arrow Y1 direction side) of the first Y-axis comb electrode 60 in the Y-axis direction. The proof masses 62 extend in the Y-axis direction on both ends of the first Y-axis sensor element 11 in the X-axis direction. The proof masses 62 are U-shaped as viewed from the arrow Z1 direction side, and the proof masses 62 and the mounting leg 64 define a frame shape. The mounting leg 64 is arranged to make a connection between the support 63 and the proof masses 62. The mounting leg 64 is configured such that the proof masses 62 are deformed movably in the Y-axis direction. Thus, both the proof masses 62 and the plurality of movable electrode fingers 66 are inertially movable. The fixed electrode body 61 and the support 63 are connected to the control circuit 40 through a terminal 34 and the wire 41, as shown in FIG. 2. In FIG. 1, illustration of the terminal 34 and the wire 41 is omitted.

As shown in FIG. 4, the first Y-axis sensor element 11 and the second Y-axis sensor element 12 are substantially line-symmetric with each other about a line segment C1, as viewed from the arrow Z1 direction side. The line segment C1 is a line segment that passes through an intermediate point C2 between the first region R1 and the second region R2 and extends along a direction (X-axis direction) orthogonal to a direction (Y-axis direction) in which the first Y-axis sensor element 11 and the second Y-axis sensor element 12 are arrayed. For example, the intermediate point C2 is an intermediate point between a geometric barycentric position G1 of the first region R1 and a geometric barycentric position G2 of the second region R2. The first Y-axis sensor element 11 and the second Y-axis sensor element 12 are arranged adjacent to each other along the Y-axis direction, and the line segment C1 defines a boundary line between the first region R1 and the second region R2.

Specifically, the second Y-axis sensor element 12 includes a second Y-axis comb electrode 70 that is line-symmetric with the first Y-axis comb electrode 60 about the line segment C1. More specifically, the second Y-axis comb electrode 70 is configured as a MEMS element, and includes a fixed electrode body 71, proof masses 72, a support 73, a mounting leg 74, a plurality of fixed electrode fingers 75, and a plurality of movable electrode fingers 76. The second Y-axis comb electrode 70 is an example of a "first comb electrode" in the claims. The fixed electrode body 71 and the support 73 are examples of a "second fixed part" in the claims. The fixed electrode fingers 75 are examples of a "first fixed electrode finger" in the claims. The movable electrode fingers 76 are examples of a "first movable electrode finger" in the claims.

The fixed electrode body 71, the proof masses 72, the support 73, the mounting leg 74, the plurality of fixed electrode fingers 75, and the plurality of movable electrode fingers 76 of the second Y-axis sensor element 12 are line-symmetric with the fixed electrode body 61, the proof masses 62, the support 63, the mounting leg 64, the plurality of fixed electrode fingers 65, and the plurality of movable electrode fingers 66 of the first Y-axis sensor element 11, respectively, about the line segment C1. Thus, the intermediate point C2 coincides with an intermediate point between the fixed electrode body 61 and the fixed electrode body 71 and an intermediate point between the support 63 and the support 73. The proof masses 62 and the proof masses 72 are integral and unitary with each other, and are H-shaped as viewed from the arrow Z1 direction side.

Figure 5:
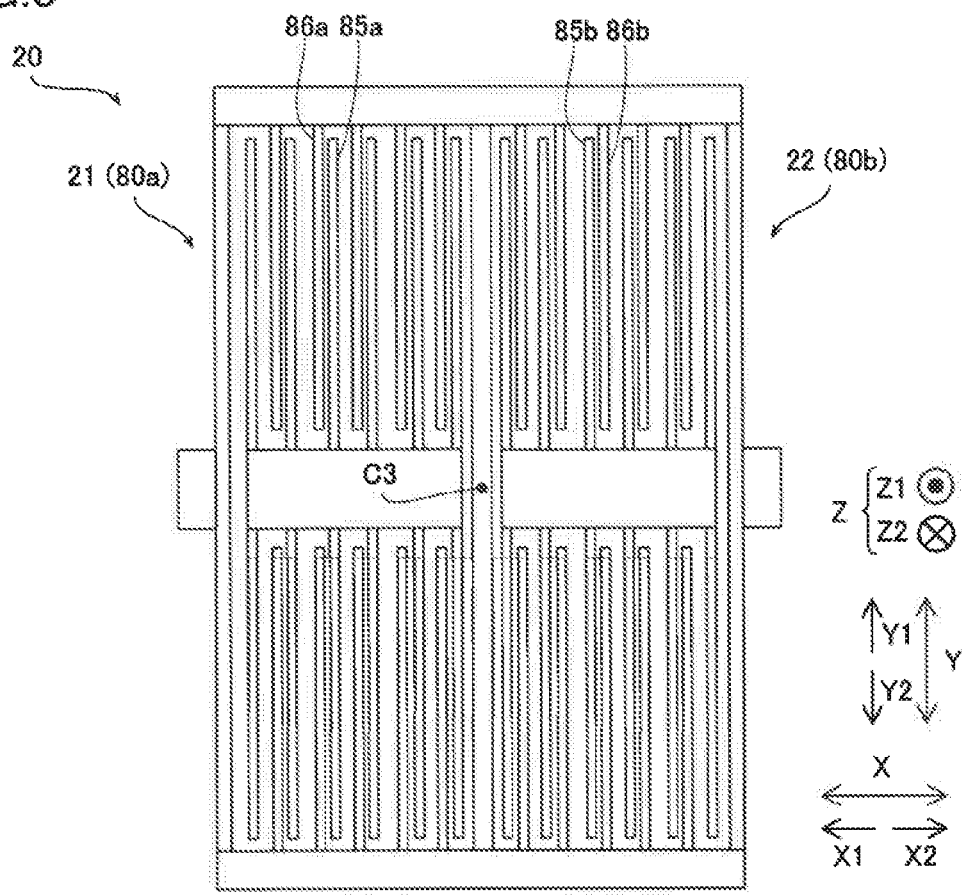
FIG. 5 A plan view showing the structure of an X-axis sensor element of the accelerometer according to the embodiment of the present invention.

As shown in FIG. 5, the X-axis sensor element 20 has a shape obtained by rotating the Y-axis sensor element 10 by a rotation angle of 90 degrees about the intermediate point C2, as viewed from the arrow Z1 direction side. The intermediate point of the X-axis sensor element 20 is set to C3. The X-axis sensor element 20 includes the first X-axis sensor element 21 and the second X-axis sensor element 22. The first X-axis sensor element 21 includes a first X-axis comb electrode 80a including fixed electrode fingers 85a and movable electrode fingers 86a that extend along the short-side direction (Y-axis direction) of the substrate 30. The first X-axis sensor element 21 further includes a second X-axis comb electrode 80b that is arranged adjacent to the first X-axis comb electrode 80a in the longitudinal direction and includes fixed electrode fingers 85b and movable electrode fingers 86b that extend along the short-side direction (Y-axis direction) of the substrate 30.

(Structure of Control Circuit)

Figure 6:
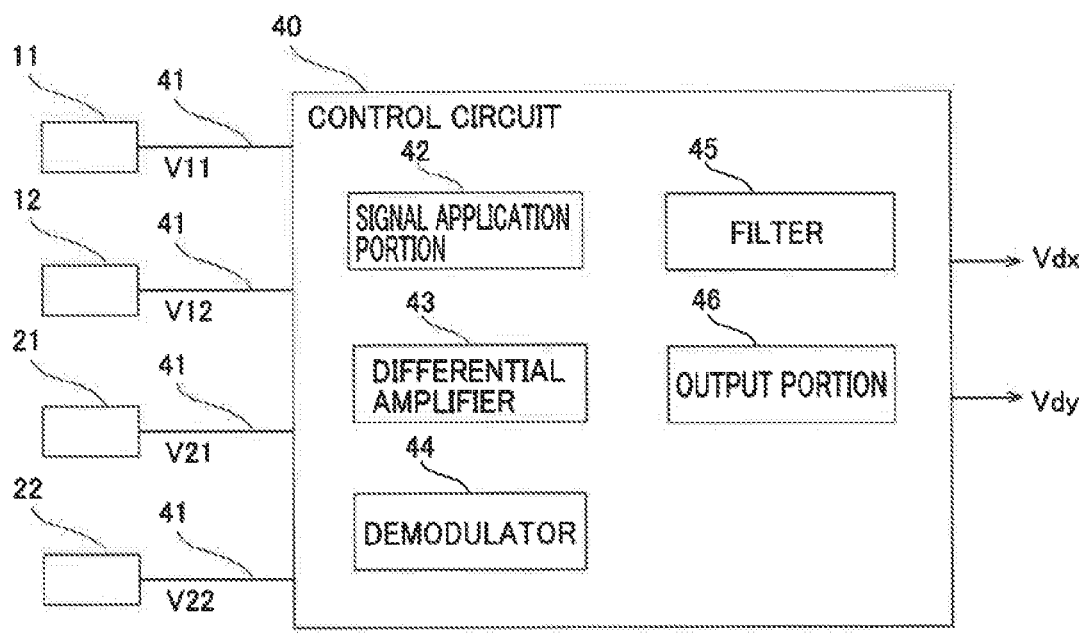
FIG. 6 A block diagram showing the structure of a control circuit of the accelerometer according to the embodiment of the present invention.

As shown in FIG. 6, the control circuit 40 is configured as an integrated circuit (ASIC: application specific integrated circuit, for example). According to this embodiment, the control circuit 40 outputs a differential value Vdy between a value V11 detected by the first Y-axis sensor element 11 and a value V12 detected by the second Y-axis sensor element 12. The control circuit 40 also outputs a differential value Vdx between a value V21 detected by the first X-axis sensor element 21 and a value V22 detected by the second X-axis sensor element 22.

Specifically, the control circuit 40 provides open-loop control. More specifically, the control circuit 40 includes a signal applied part 42, a differential amplification part 43, a demodulator 44, a filter 45, and an output portion 46, and forms an open control loop circuit (open loop). The signal applied part 42 transmits a first applied signal of a square wave to the first Y-axis sensor element 11 through the wire 41, and transmits a second applied signal of a square wave opposite in phase to the first applied signal to the second Y-axis sensor element 12 through the wire 41. The signal applied part 42 also transmits applied signals to the X-axis sensor element 20 similarly to the Y-axis sensor element 10.

The differential amplification part 43 acquires the detected value V11 from the first Y-axis sensor element 11 through the wire 41 and acquires the detected value V12 from the second Y-axis sensor element 12 through the wire 41, and outputs the differential value Vdy between the detected value V11 and the detected value V12. The differential amplification part 43 may acquire a differential signal (V11-V12) from the first Y-axis sensor element 11 and the second Y-axis sensor element 12.

The demodulator 44 demodulates the differential value Vdy based on the frequencies of the first applied signal and the second applied signal of the signal applied part 42. The filter 45 is configured as a low-pass filter, for example, and outputs the differential value Vdy, the high-frequency component of which has been reduced. The control circuit 40 outputs the differential value Vdx in a manner similar to the differential value Vdy. The control circuit 40 is connected to an unillustrated terminal that is exposed on the outside surface of the package base 50, and can externally output the differential value Vdy and the differential value Vdx.

(Structure of Package Base)

As shown in FIG. 2, the package base 50 has a coefficient of linear expansion of at least 4.0 ppm/K and not more than 8.0 ppm/K (6.6 ppm/K, for example), for example. For example, the package base 50 includes alumina ceramics ($Al_2O_3$). The accelerometer 100 includes a cover and a sealing member that are not illustrated, and an internal space in which the substrate 30 and the control circuit 40 are arranged is sealed by the package base 50, the cover, and the sealing member.

(Structure of Bonding Member)

Figure 7:
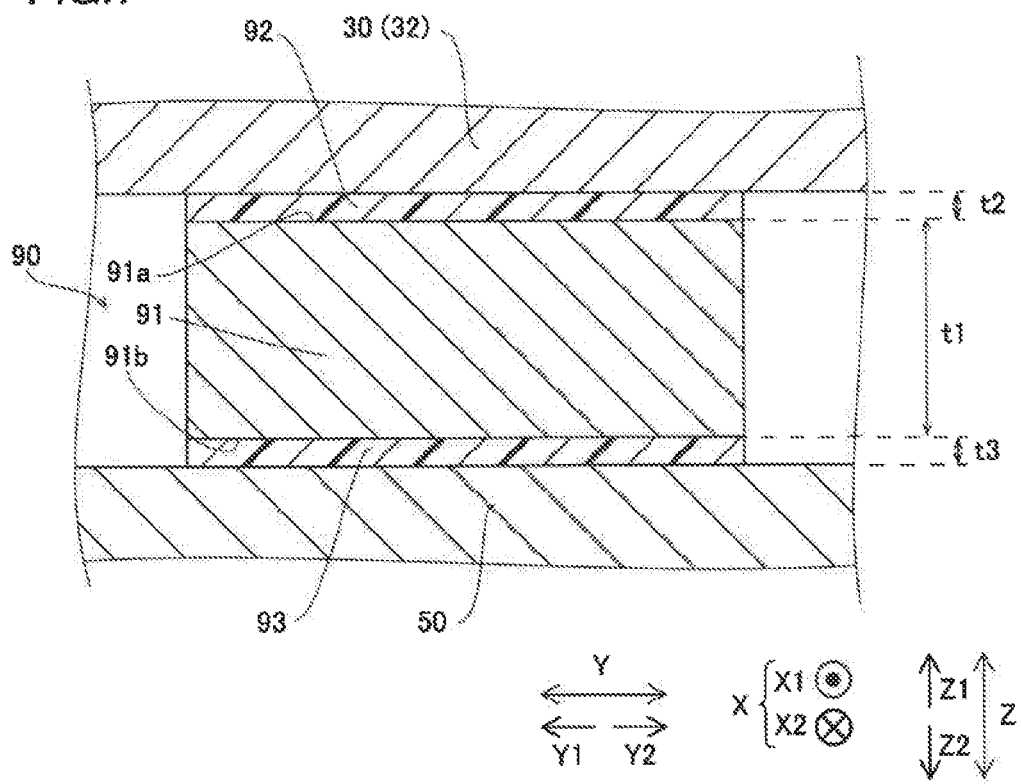
FIG. 7 A sectional view showing the structure of a bonding member of the accelerometer according to the embodiment of the present invention.

According to this embodiment, the bonding member 90 includes a pedestal 91, a first adhesion layer 92 arranged on a surface 91a of the pedestal 91 closer to the substrate 30, and a second adhesion layer 93 arranged on a surface 91b of the pedestal 91 closer to the package base 50, as shown in FIG. 7. In other words, the first adhesion layer 92 bonds the pedestal 91 to the substrate 30. The second adhesion layer 93 bonds the pedestal 91 to the package base 50. The first adhesion layer 92 and the second adhesion layer 93 are examples of an "adhesion layer" in the claims.

Specifically, the pedestal 91 includes a material having a coefficient of linear expansion of at least 3 ppm/K and not more than 4 ppm/K. The pedestal 91 includes a material having a coefficient of thermal conductivity of at least 140 W/m·K. The pedestal 91 preferably includes a material having a coefficient of thermal conductivity of 160 W/m·K.

For example, the pedestal 91 includes silicon, has a coefficient of linear expansion of at least 3 ppm/K and not more than 4 ppm/K, and has a coefficient of thermal conductivity of 160 W/m·K.

In other words, according to this embodiment, the pedestal 91 is made of silicon that is the same material as the silicon layer 31 of the substrate 30. Thus, the coefficient of linear expansion of the pedestal 91 can be set to a value close to (substantially equal to) the coefficient of linear expansion of the silicon layer 31 of the substrate 30. The lower glass layer 32 and the upper glass layer 33 of the substrate 30 each have a coefficient of linear expansion of at least 3 ppm/K and not more than 4 ppm/K, and hence the pedestal 91 and the lower and upper glass layers 32 and 33 have substantially the same coefficient of linear expansion.

The pedestal 91 is made of the material having a coefficient of thermal conductivity of at least 140 W/m·K such that the hysteresis of stress to the substrate 30 caused by a difference in thermal expansion between the package base 50 and the substrate 30 with respect to the temperature change of the package base 50 can be made good (the hysteresis area can be reduced). As stated earlier, a stress caused by a difference in coefficient of linear expansion between the substrate 30 and the package base 50 is generated on the substrate 30. When the temperature of the package base 50 is changed by heat transfer from another member or the like, the temperature change is transmitted to the substrate 30 through the bonding member 90. On the other hand, the heat followability of the substrate 30, on which the Y-axis sensor element 10 and the X-axis sensor element 20 are arranged, with respect to the package base 50 is improved as described above, such that a difference in temperature between the substrate 30 and the package base 50 can be reduced. Consequently, the hysteresis area of the bias value with respect to the temperature change in the accelerometer 100 can be reduced.

As shown in FIG. 4, the pedestal 91 (bonding member 90) has a substantially circular shape (a circular shape), as viewed along arrow Z1. For example, the pedestal 91 has a circular disc shape (columnar shape) that is centered on the intermediate point C2 and has a diameter D1 and a thickness t1 (see FIG. 7). In other words, according to this embodiment, the pedestal 91 is arranged in the region R3 that includes the intermediate point C2 between the fixed electrode bodies 61 and 71 and straddles the first region R1 and the second region R2, as viewed from the arrow Z1 direction side. The pedestal 91 is line-symmetric about the line segment C1. The pedestal 91 is also line-symmetric about the intermediate point C2.

According to this embodiment, the diameter D1 of the pedestal 91 (bonding member 90) is 0.4 or more times and 1 or less times as large as a length L1 from the end 60a on the arrow Y1 direction side in the first region R1 of the substrate 30 to an end 70a on the arrow Y2 direction side in the second region R2 of the substrate 30. When the length L1 is about 1.6 mm, for example, the pedestal 91 has a diameter D1 of at least 0.8 mm ϕ and not more than 1.6 mm ϕ (preferably 1.1 mm ϕ). Furthermore, the pedestal 91 has a thickness t1 (see FIG. 7) of at least 90 μm and not more than 110 μm (preferably 100 μm), for example.

When the diameter D1 of the bonding member 90 is set to at least 0.8 mm ϕ, the shock resistance can be ensured. The bonding strength of the bonding member 90 at least with respect to acceleration within a specification limit can be ensured, for example. In addition, when the diameter D1 of the bonding member 90 is set to not more than 1.6 mm ϕ, the influence of the thermal expansion distortion of the bonding member 90 can be reduced. Thus, the influence of the thermal expansion distortion of the bonding member 90 can be reduced enough to be ignorable as influence on the values detected by the Y-axis sensor element 10.

As shown in FIG. 7, the first adhesion layer 92 and the second adhesion layer 93 are made of the same material. The first adhesion layer 92 and the second adhesion layer 93 include an epoxy resin having a viscosity of not more than 30 Pa·s (preferably 20 Pa·s), for example. The glass-transition temperature of each of the first adhesion layer 92 and the second adhesion layer 93 is a temperature (a temperature that exceeds an operating temperature range) that exceeds 125° C., and is about 158° C., for example. The first adhesion layer 92 and the second adhesion layer 93 each include a thermosetting resin.

If the viscosity is not more than 30 Pa·s, the first adhesion layer 92 and the second adhesion layer 93 can wet out when arranged (applied) between the pedestal 91 and the substrate 30 or between the pedestal 91 and the package base 50.

As shown in FIG. 7, each of the thickness t2 of the first adhesion layer 92 and the thickness t3 of the second adhesion layer 93 is smaller than the thickness t1 of the pedestal 91. Each of the thickness t2 of the first adhesion layer 92 and the thickness t3 of the second adhesion layer 93 is several μm smaller than 100 μm, for example, and the first adhesion layer 92 and the second adhesion layer 93 preferably have thicknesses t2 and t3 of about 2 μm, respectively.

[Method for Manufacturing Accelerometer]

A method for manufacturing the accelerometer 100 according to this embodiment is now described with reference to FIGS. 1, 2, 7, and 8. Particularly, a method for arranging the bonding member 90 is described.

As shown in FIG. 1, the substrate 30 on which the Y-axis sensor element 10 and the X-axis sensor element 20 are arranged is prepared. Furthermore, the package base 50, the pedestal 91, and the epoxy resin are prepared.

Figure 8:
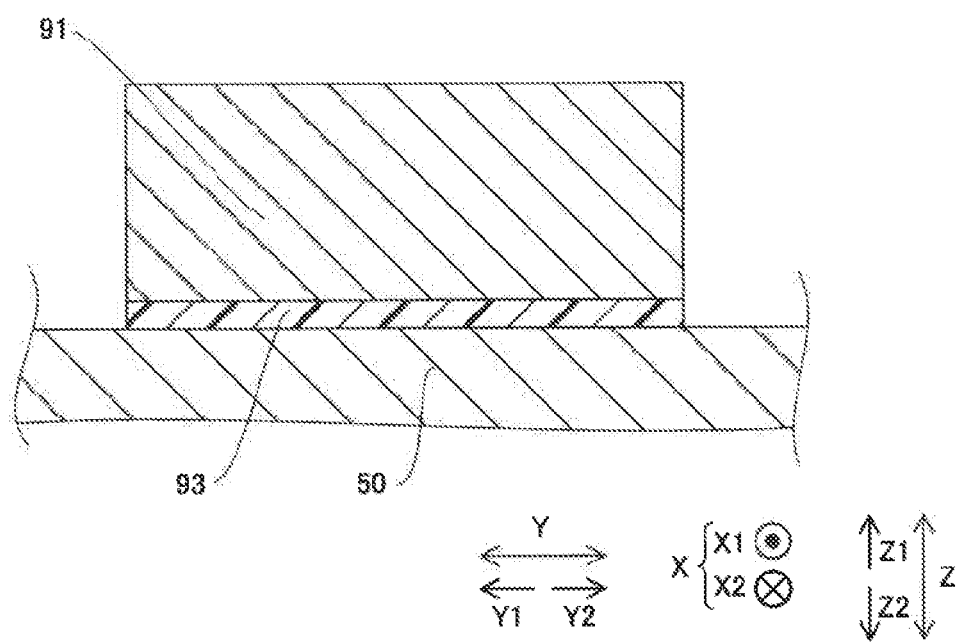
FIG. 8 A sectional view for illustrating a method for arranging the bonding member of the accelerometer according to the embodiment of the present invention.

As shown in FIG. 8, the epoxy resin is applied onto a surface of the package base 50, and the pedestal 91 is placed from the arrow Z1 direction side of the applied epoxy resin. Then, the epoxy resin is heated (heated to about 150° C. or more, for example), wets out on the pedestal 91, and is temporarily cured such that the second adhesion layer 93 is formed.

Then, the epoxy resin is applied onto the surface 91a of the pedestal 91 on the arrow Z1 direction side, and the substrate 30 is arranged on the arrow Z1 direction side of the epoxy resin. At this time, according to this embodiment, the pedestal 91 and the applied epoxy resin are arranged in the region R3 that is smaller than the substrate 30 and straddles the first region R1 of the substrate 30 in which the first Y-axis sensor element 11 is arranged and the second region R2 of the substrate 30 in which the second Y-axis sensor element 12 is arranged as viewed from the arrow Z1 direction side, as shown in FIG. 1.

Then, the epoxy resin is heated, wets out on the pedestal 91, and is cured such that the first adhesion layer 92 is formed. Then, the first adhesion layer 92 and the second adhesion layer 93 (bonding member 90) are formed such that the pedestal 91 is fixed to the package base 50 and the substrate 30, and the package base 50 and the substrate 30 are bonded to each other by the bonding member 90, as shown in FIG. 7. Then, a step of mounting the control circuit 40 on the package base 50, a step of bonding the wire 41, etc. are performed such that the accelerometer 100 is manufactured.

[Effects of This Embodiment]

According to this embodiment, the following effects can be obtained.

According to this embodiment, as hereinabove described, the bonding member 90 is arranged in the region R3 that is smaller than the substrate 30 and straddles the first region R1 of the substrate 30 in which the first Y-axis sensor element 11 is arranged and the second region R2 of the substrate 30 in which the second Y-axis sensor element 12 is arranged in the plan view (as viewed from the arrow Z1 direction side). Thus, as compared with the case where the bonding member 90 is arranged in an entire region of the substrate 30 in the plan view, the region in which the bonding member 90 is arranged is reduced in size, and hence a decrease in performance as the accelerometer 100 caused by thermal expansion distortion transmitted from the package base 50 to the substrate 30 through the bonding member 90 can be significantly reduced or prevented. Furthermore, the bonding member 90 is arranged in the region R3 that straddles the first region R1 and the second region R2 in the plan view such that the influence of the thermal expansion distortion on the value V11 detected by the first Y-axis sensor element 11 and the influence of the thermal expansion distortion on the value V12 detected by the second Y-axis sensor element 12 cancel each other out in the differential value Vdy, and hence a decrease in performance as the accelerometer 100 due to bonding of dissimilar materials (the substrate 30 and the package base 50) to each other can be further significantly reduced or prevented. Moreover, the bonding member 90 is arranged to overlap a region in which the Y-axis sensor element 10 is arranged in the plan view such that an increase in the size of the substrate 30 can be significantly reduced or prevented, unlike the case where the bonding member 90 is provided in a region of the substrate 30 in which the Y-axis sensor element 10 and the X-axis sensor element 20 are not arranged.

According to this embodiment, as hereinabove described, the pedestal 91, the first adhesion layer 92 arranged on the surface 91a of the pedestal 91 closer to the substrate 30, and the second adhesion layer 93 arranged on the surface 91b of the pedestal 91 closer to the package base 50 are provided in the bonding member 90. Thus, unlike a resin adhesive, a change in the shape of the pedestal 91 at the time of arrangement is small such that a variation in the shape is reduced, and hence a variation in the shape of the bonding member 90 can be significantly reduced or prevented. Furthermore, the pedestal 91 is provided, and hence the thickness t2 (amount) of the first adhesion layer 92 and the thickness t3 (amount) of the second adhesion layer 93 can be reduced, as compared with the case where the bonding member 90 includes only the resin adhesive. Thus, variations in the amounts and shapes of the first adhesion layer 92 and the second adhesion layer 93 can be significantly reduced or prevented. Consequently, a variation in the performance of the accelerometer 100 can be significantly reduced or prevented.

According to this embodiment, as hereinabove described, the thickness t2 of the first adhesion layer 92 and the thickness t3 of the second adhesion layer 93 are smaller than the thickness t1 of the pedestal 91. Thus, the thickness t2 of the first adhesion layer 92 and the thickness t3 of the second adhesion layer 93 can be further reduced, and hence variations in the amounts and shapes of the first adhesion layer 92 and the second adhesion layer 93 can be further significantly reduced or prevented.

According to this embodiment, as hereinabove described, the first adhesion layer 92 and the second adhesion layer 93 include the epoxy resin having a viscosity of not more than 30 Pa·s. If the bonding member 90 includes a silicone resin having a relatively high viscosity (more than 30 Pa·s), due to the high viscosity, the application amount may not be easily adjusted, or the wettability is reduced such that a variation in an application region may become large. The stress inflection point of the silicone resin is within a range from −30° C. to −10° C. The operating temperature range of a common accelerometer is from −40° C. to 125° C., for example. When the accelerometer is used within this operating temperature range, the stress characteristics of the silicone resin are changed such that the performance of the accelerometer may be decreased. On the other hand, according to this embodiment, the first adhesion layer 92 and the second adhesion layer 93 include the epoxy resin having a viscosity of not more than 30 Pa·s. Thus, the viscosities of the first adhesion layer 92 and the second adhesion layer 93 can be reduced, and hence the application amount can be easily adjusted. Furthermore, the first adhesion layer 92 and the second adhesion layer 93 can be arranged to wet out on the pedestal 91, and hence a variation in the application region can be reduced to the degree of a variation in the shape of the pedestal 91 having a relatively small shape variation. In addition, the glass transition point (a point at which the stress characteristics are changed) of the epoxy resin is a temperature (about 158° C.) exceeding 125° C., and is out of the above operating temperature range. Consequently, unlike the case where the silicone resin is used, a change in the stress characteristics of the bonding member 90 within the operating temperature range can be significantly reduced or prevented.

According to this embodiment, as hereinabove described, the pedestal 91 includes the silicon, which is the same material as the constituent material of the substrate 30. Thus, the coefficient of linear expansion of the material included in the pedestal 91 and the coefficient of linear expansion of the constituent material of the substrate 30 can be substantially equal to each other, and hence the thermal expansion distortion of the bonding member 90 due to different coefficients of linear expansion can be effectively significantly reduced or prevented.

According to this embodiment, as hereinabove described, the bonding member 90 has the substantially circular shape in the plan view. If the bonding member 90 has a shape having corners, such as a rectangular shape, in the plan view, stress concentration easily occurs in these corners. In consideration of this point, according to this embodiment, the bonding member 90 has the substantially circular shape in the plan view, and hence stress concentration can be significantly reduced or prevented due to no corner in the bonding member 90. Thus, distortion in the bonding member 90 can be effectively significantly reduced or prevented.

According to this embodiment, as hereinabove described, in the plan view, the bonding member 90 is line-symmetric about the line segment C1 that passes through the intermediate point C2 between the first region R1 and the second region R2 and is orthogonal to the direction in which the first Y-axis sensor element 11 and the second Y-axis sensor element 12 are arrayed. Thus, a portion of the bonding member 90 arranged in the first region R1 and a portion of the bonding member 90 arranged in the second region R2 are line-symmetric with each other, and hence the influence of thermal expansion distortion transmitted to the first Y-axis sensor element 11 and the influence of thermal expansion distortion transmitted to the second Y-axis sensor element 12 can be made more equal to each other.

According to this embodiment, as hereinabove described, the fixed electrode body 61 and the support 63 to secure the first Y-axis sensor element 11 to the substrate 30 are provided on the first Y-axis sensor element 11. Furthermore, the fixed electrode body 71 and the support 73 to secure the second Y-axis sensor element 12 to the substrate 30, which are line-symmetric with the fixed electrode body 61 and the support 63 about the line segment Cl, are provided on the second Y-axis sensor element 12. In addition, the bonding member 90 is arranged in the region R3 that includes the intermediate point C2 between both the fixed electrode body 61 and the support 63 and both the fixed electrode body 71 and the support 73 and straddles the first region R1 and the second region R2 in the plan view. Thermal expansion distortion is transmitted to both the fixed electrode body 61 and the support 63 and both the fixed electrode body 71 and the support 73 through the substrate 30 (lower glass layer 32). In view of this point, according to this embodiment, the accelerometer 100 is configured as described above, whereby the influence of the thermal expansion distortion transmitted to both the fixed electrode body 61 and the support 63 and the influence of the thermal expansion distortion transmitted to both the fixed electrode body 71 and the support 73 can be made equal to each other. Consequently, the influence of the thermal expansion distortion transmitted to the first Y-axis sensor element 11 and the influence of the thermal expansion distortion transmitted to the second Y-axis sensor element 12 can be more reliably made equal to each other.

According to this embodiment, as hereinabove described, the first Y-axis sensor element 11 is configured as the MEMS, and the first Y-axis comb electrode 60 including the fixed electrode fingers 65 and the movable electrode fingers 66 is provided on the first Y-axis sensor element 11. Furthermore, the second Y-axis sensor element 12 is configured as the MEMS, and the second Y-axis comb electrode 70 including the fixed electrode fingers 75 and the movable electrode fingers 76 is provided on the second Y-axis sensor element 12. Thus, acceleration can be detected by the first Y-axis comb electrode 60 and the second Y-axis comb electrode 70. It is particularly effective to apply this embodiment capable of significantly reducing or preventing a decrease in its performance as the accelerometer 100 due to thermal expansion distortion to a MEMS sensor that includes the first Y-axis comb electrode 60 and the second Y-axis comb electrode 70 and is easily influenced by the thermal expansion distortion.

According to this embodiment, as hereinabove described, the first Y-axis sensor element 11 and the second Y-axis sensor element 12 are arranged on the portion P1 of the substrate 30 on the first side in the longitudinal direction. Furthermore, the X-axis sensor element 20 that includes the first X-axis comb electrode 80a including the fixed electrode fingers 85a and the movable electrode fingers 86a and the second X-axis comb electrode 80b including the fixed electrode fingers 85b and the movable electrode fingers 86b and is arranged on the portion P2 of the substrate 30 on the second side in the longitudinal direction is provided in the accelerometer 100. In addition, the fixed electrode fingers 65 and 75 and the movable electrode fingers 66 and 75 of the first Y-axis comb electrode 60 and the second Y-axis comb electrode 70 extend along the longitudinal direction of the substrate 30. The fixed electrode fingers 85a and 85b and the movable electrode fingers 86a and 86b of the first X-axis comb electrode 80a and the second X-axis comb electrode 80b extend along the short-side direction of the substrate 30. Moreover, the portion P1 of the substrate 30 on the first side in the longitudinal direction and the package base 50 are bonded to each other through the bonding member 90, and the portion P2 of the substrate 30 on the second side in the longitudinal direction and the package base 50 are spaced apart from each other without the bonding member 90.

Figure 20:
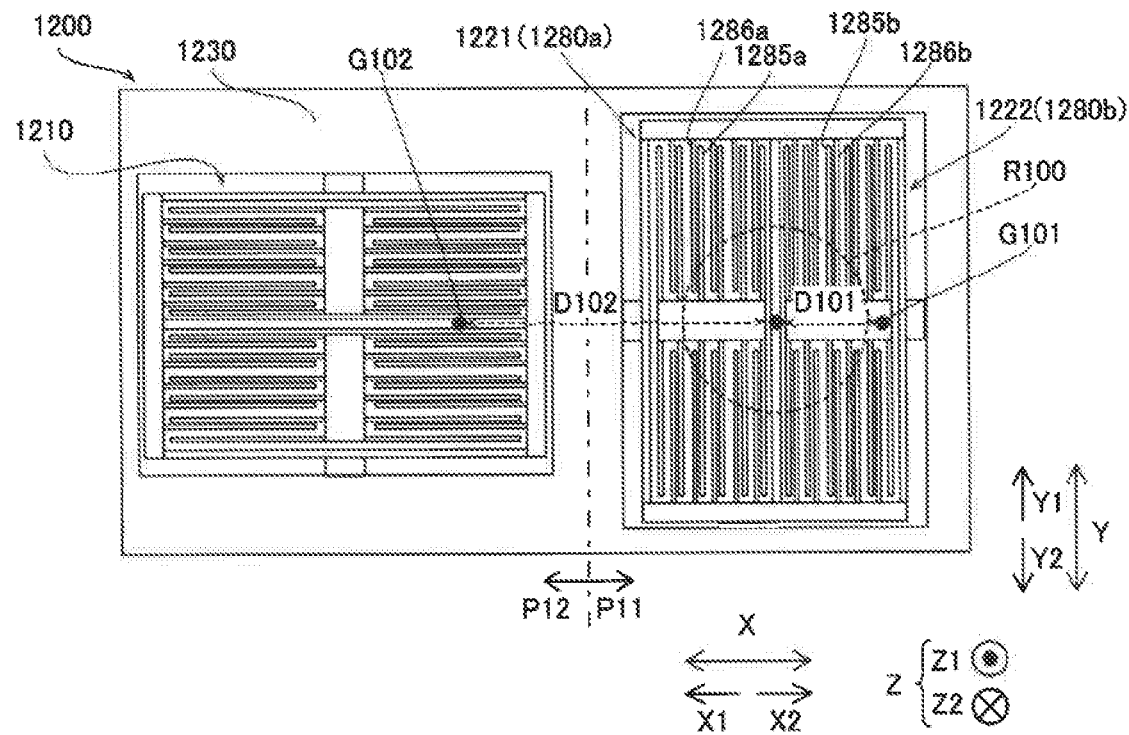
FIG. 20 A sectional view showing the structure of an accelerometer according to a comparative example.

FIG. 20 shows an accelerometer 1200 according to a comparative example. As shown in FIG. 20, in the accelerometer 1200 according to the comparative example, a first X-axis sensor element 1221 and a second X-axis sensor element 1222 are arranged in parallel to each other in a longitudinal direction, and a first X-axis comb electrode 1280a of the first X-axis sensor element 1221 and a second X-axis comb electrode 1280b of the second X-axis sensor element 1222 extend along the short-side direction of a substrate 1230.

Figure 21:
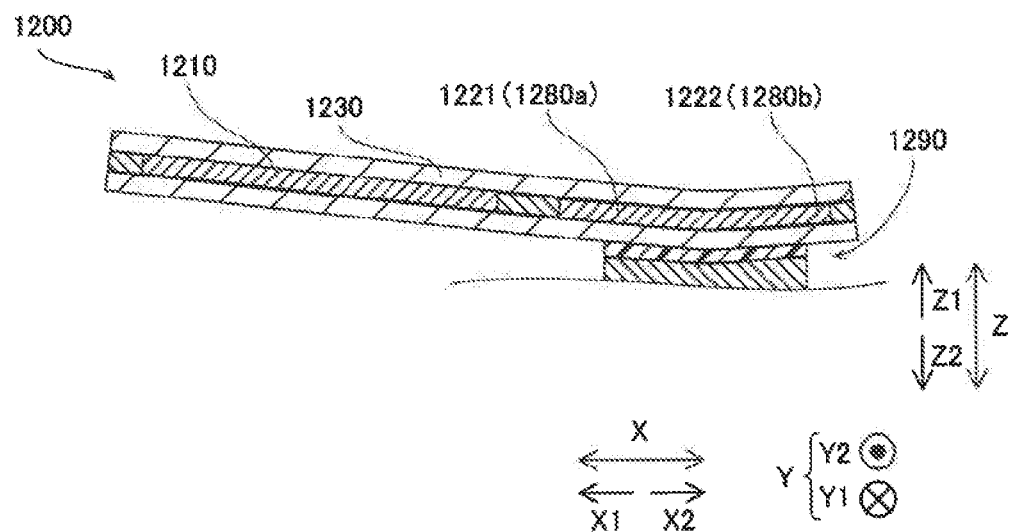
FIG. 21 A plan view showing the structure of the accelerometer according to the comparative example.

As shown in FIG. 21, when a stress is applied to the substrate 1230 due to the thermal expansion of a package base 50, a portion (a portion P11 of the substrate 1230 on a first side in the longitudinal direction) bonded by a bonding member 1290 is restrained by the bonding member 1290 to be curved by the thermal expansion distortion of the package base 50 transmitted to the substrate 1230 through the bonding member 1290 whereas a portion (a portion P12 of the substrate 1230 on a second side in the longitudinal direction) other than the portion bonded by the bonding member 1290 is substantially linearly deformed (inclined), as viewed from an arrow Y2 direction side. Therefore, in the accelerometer 1200 according to the comparative example, intervals between fixed electrode fingers 1285a (1285b) (see FIG. 20) and movable electrode fingers 1286a (1286b) are changed with the curvature, and this causes the bias or drift of detected values. When the package base 50 is heat shrunk, the bonding member 1290 and the portion of the substrate 1230 restrained by the bonding member 1290 are curved in a direction opposite to a direction shown in FIG. 21, and the portion other than the portion bonded by the bonding member 1290 is substantially linearly deformed (inclined) toward an arrow Z2 direction side in FIG. 21.

Furthermore, when the first X-axis sensor element 1221 and the second X-axis sensor element 1222 are arranged on the portion P11 of the substrate 1230 on the first side in the longitudinal direction, as shown in FIG. 20, a difference is generated between a distance D101 from the center point of a region R100 (hereinafter referred to as a "restraint region R100") in which the substrate 1230 is restrained by the bonding member 1290 to the center of gravity G101 of the portion of the substrate 1230 on the first side in the longitudinal direction and a distance D102 from the center point of the restraint region R100 to the center of gravity G102 of the portion of the substrate 1230 on the second side in the longitudinal direction, for example. Thus, due to this difference in distance, a difference is generated between the magnitude of a moment applied from the first side in the longitudinal direction to the restraint region R100 and the magnitude of a moment applied from the second side in the longitudinal direction to the restraint region R100. Consequently, also in the restraint region R100, a difference is generated between the magnitude of distortion on the first side in the longitudinal direction and the magnitude of distortion on the second side in the longitudinal direction (the amount of change in the intervals between the fixed electrode fingers 1285a and the movable electrode fingers 1286a and the amount of deformation in the intervals between the fixed electrode fingers 1285b and the movable electrode fingers 1286b).

In the arrangement shown in FIG. 20, a difference is generated between the amount of deformation (distortion)

on the first side (closer to the first X-axis sensor element 1221) in the longitudinal direction and the amount of deformation (distortion) on the second side (closer to the second X-axis sensor element 1222) in the longitudinal direction in the restraint region R100 in which the bonding member 1290 is arranged, and hence this difference in the amount of deformation is not canceled out even when a differential value Vdx between a value V21 detected by the first X-axis sensor element 1221 and a value V22 detected by the second X-axis sensor element 1222 is acquired.

In consideration of this point, according to this embodiment, the first Y-axis comb electrode 60 of the first Y-axis sensor element 11 and the second Y-axis comb electrode 70 of the second Y-axis sensor element 12 arranged on the portion P1 of the substrate 30 bonded to the package base 50 through the bonding member 90 extend along the longitudinal direction of the substrate 30, as shown in FIGS. 1 and 4. Thus, even when due to the thermal expansion of the package base 50, the substrate 30 is curved while the portion P2 of the substrate 30 in which the X-axis sensor element 20 is arranged is inclined, intervals between the fixed electrode fingers 65 and the movable electrode fingers 66 and intervals between the fixed electrode fingers 75 and the movable electrode fingers 76 are not changed, and hence a decrease in the performance of the first Y-axis sensor element 11 and the second Y-axis sensor element 12 can be significantly reduced or prevented.

While the X-axis sensor element 20 includes the first X-axis comb electrode 80a and the second X-axis comb electrode 80b that extend along the short-side direction of the substrate 30, according to this embodiment, the X-axis sensor element 20 is arranged on the portion P2 of the substrate 30, as shown in FIG. 1. Thus, even when a stress is applied to the substrate 30, the portion P2 is substantially linearly deformed (inclined), and hence intervals between the fixed electrode fingers 85a and the movable electrode fingers 86a and intervals between fixed electrode fingers 85b and the movable electrode fingers 86b are not changed. Consequently, a decrease in the performance of the X-axis sensor element 20 can be significantly reduced or prevented. Therefore, detected values in the two axial directions can be acquired while a decrease in the performance of the Y-axis sensor element 10 and the X-axis sensor element 20 is significantly reduced or prevented.

Figure 22:
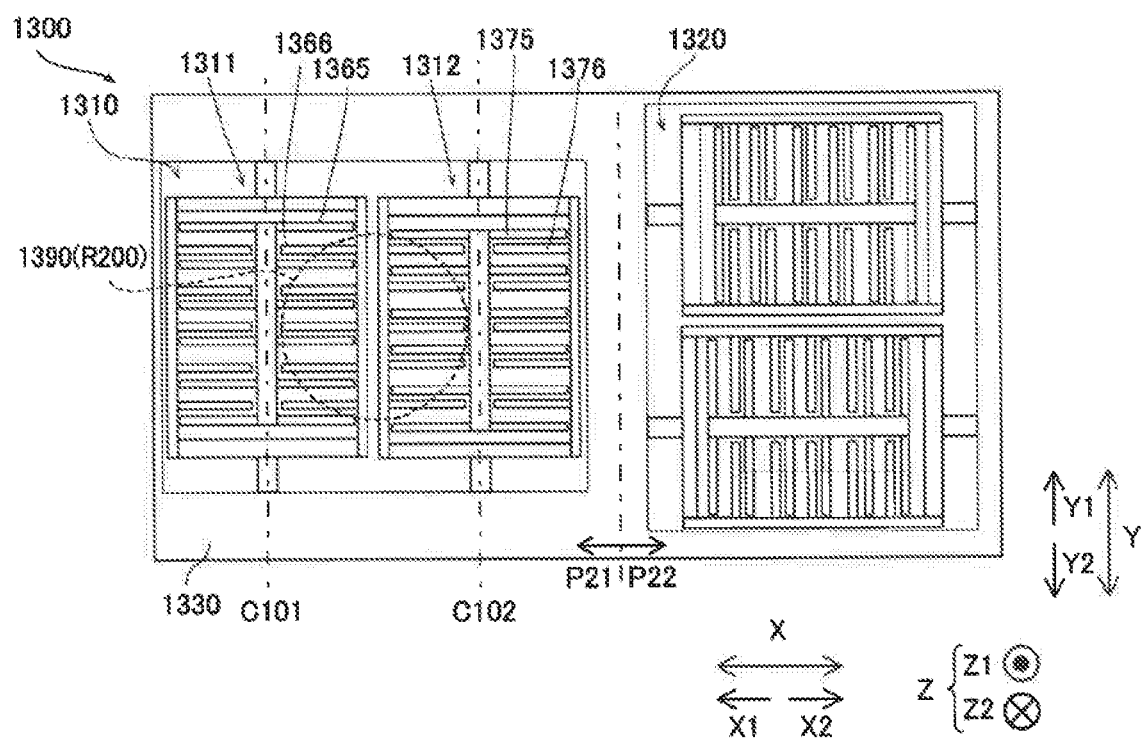
FIG. 22 A plan view showing the structure of an accelerometer according to an eleventh modification of the embodiment of the present invention.

When a first Y-axis sensor element 1311 including fixed electrode fingers 1365 and movable electrode fingers 1366 that extend along a longitudinal direction and a second Y-axis sensor element 1312 including fixed electrode fingers 1375 and movable electrode fingers 1376 that extend along the longitudinal direction are arranged in parallel to each other in the longitudinal direction (X-axis direction) as in an eleventh modification shown in FIG. 22, the position of a detection axis C101 of the first Y-axis sensor element 1311 and the position of a detection axis C102 of the second sensor element are deviated from each other (two axes are formed) in the longitudinal direction, and hence the detection accuracy may be reduced due to this deviation of the detection axes.

On the other hand, according to this embodiment, the first Y-axis sensor element 11 and the second Y-axis sensor element 12 are arrayed in parallel to each other in the short-side direction (Y-axis direction) of the substrate 30 on the portion P1 of the substrate 30 on the first side in the longitudinal direction. Thus, even when a difference is generated between the magnitude of distortion on the first side in the longitudinal direction and the magnitude of distortion on the second side in the longitudinal direction in the region R3 of the substrate 30 in which the bonding member 90 is arranged, the difference Vdy between the value V11 and the value V12 detected by the first Y-axis sensor element 11 and the second Y-axis sensor element 12 arrayed in parallel to each other in the short-side direction of the substrate 30 is acquired such that the influence of the distortion on the first side in the longitudinal direction and the influence of the distortion on the second side in the longitudinal direction cancel each other out, and hence a decrease in performance as the accelerometer 100 can be significantly reduced or prevented. Furthermore, as shown in FIG. 4, the position of the detection axis C100 of the first Y-axis sensor element 11 and the position of the detection axis C100 of the second Y-axis sensor element 12 can coincide with each other (one axis can be formed), and hence the detection accuracy can be improved.

[Modifications]

The embodiment disclosed this time must be considered as illustrative in all points and not restrictive. The range of the present invention is shown not by the above description of the embodiment but by the scope of claims for patent, and all modifications within the meaning and range equivalent to the scope of claims for patent are further included.

Figure 9:
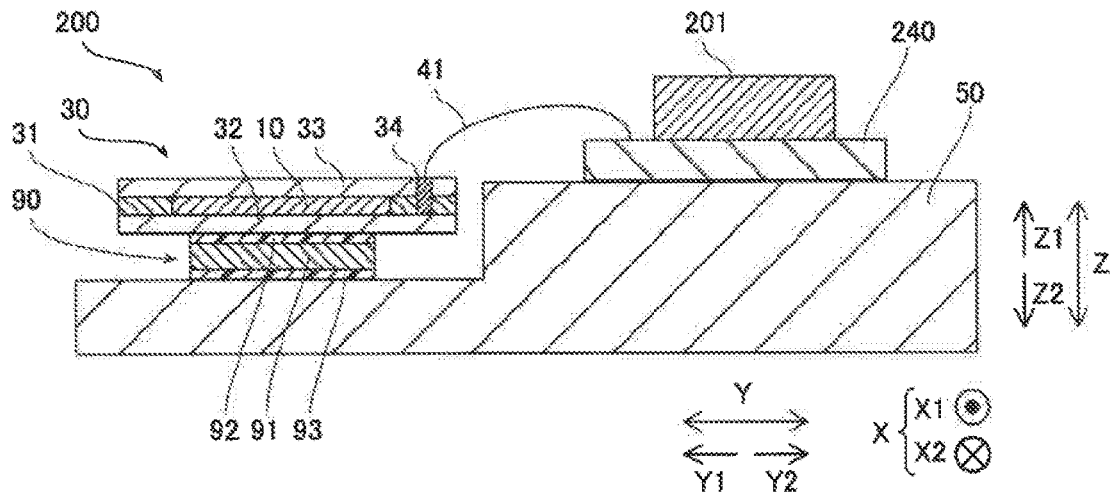
FIG. 9 A sectional view showing the structure of an inertial sensor according to a first modification of the embodiment of the present invention.

For example, while the present invention is applied to the accelerometer 100 in the aforementioned embodiment, the present invention is not restricted to this. As in a first modification shown in FIG. 9, for example, a bonding member 90 may be provided in an inertial sensor 200 including an angular velocity sensor (gyro sensor) 201 capable of detecting an angular velocity and a control circuit 240 corresponding to the angular velocity sensor 201.

Figure 10:
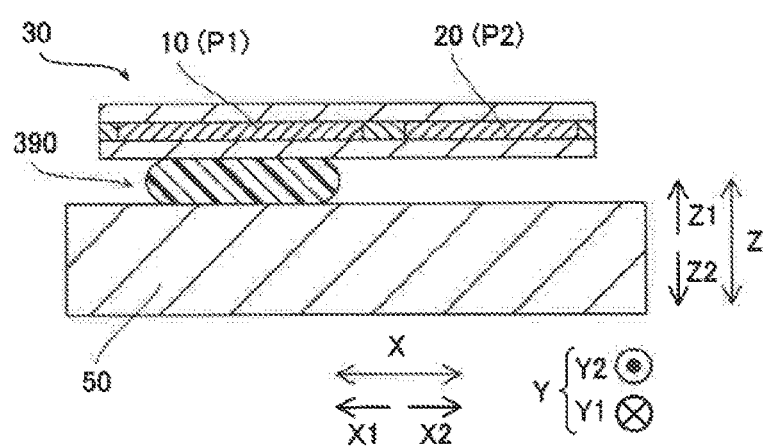
FIG. 10 A sectional view showing the structure of a bonding member according to a second modification of the embodiment of the present invention.

While the bonding member 90 includes the pedestal 91, the first adhesion layer 92, and the second adhesion layer 93 in the aforementioned embodiment, the present invention is not restricted to this. As in a second modification shown in FIG. 10, for example, a bonding member 390 may include a silicone resin.

While the first adhesion layer 92 and the second adhesion layer 93 are made of the material including the epoxy resin having a viscosity of not more than 30 Pa·s in the aforementioned embodiment, the present invention is not restricted to this. Specifically, the first adhesion layer 92 and the second adhesion layer 93 may alternatively be made of a material including an acrylic resin having a viscosity of not more than 30 Pa·s.

While the pedestal 91 includes the silicon, which is the same material as the constituent material of the silicon layer 31 of the substrate 30, such that the coefficient of linear expansion of the pedestal 91 is a value close to (substantially the same as) the coefficient of linear expansion of the substrate 30 in the aforementioned embodiment, the present invention is not restricted to this. Also when the pedestal 91 includes borosilicate glass (such as Pyrex glass or Tempax glass), which is the same material as the constituent material of the lower glass layer 32 of the substrate 30, for example, the coefficient of linear expansion of the pedestal 91 can be a value close to (substantially the same as) the coefficient of linear expansion of the substrate 30.

Figure 11:
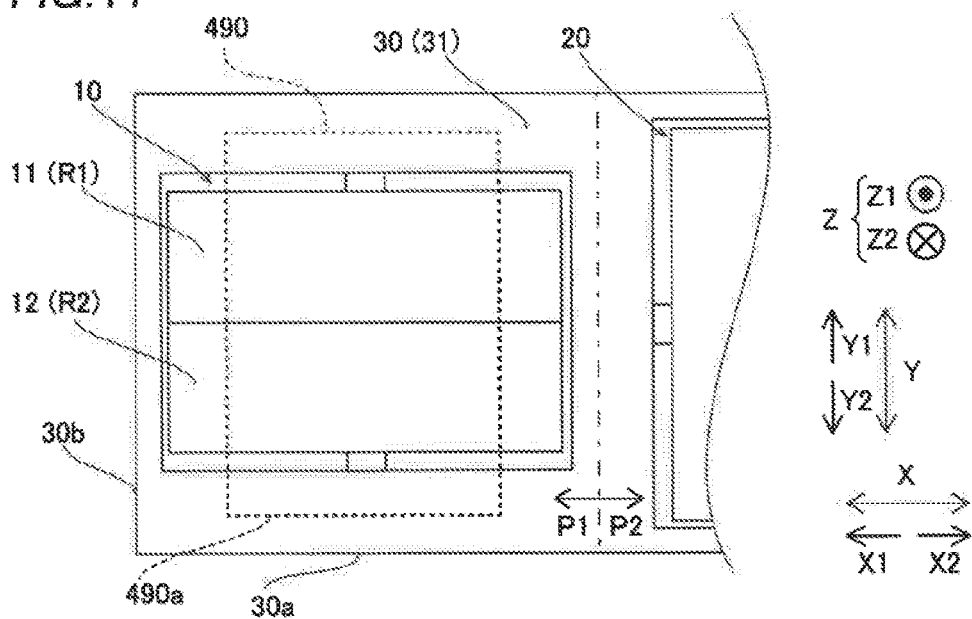
FIG. 11 A plan view showing the structure of a bonding member according to a third modification of the embodiment of the present invention.
Figure 12:
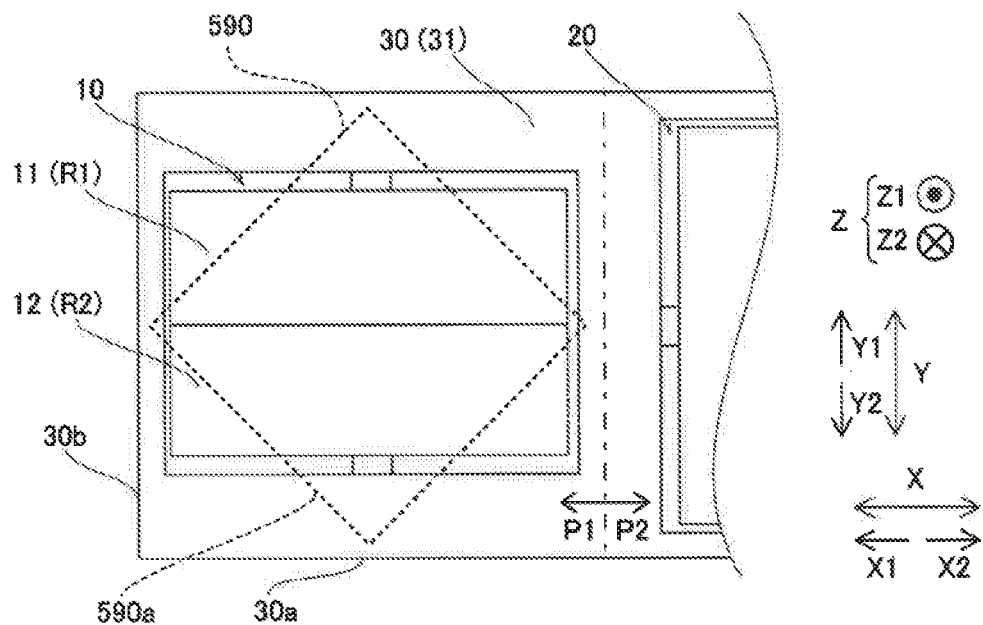
FIG. 12 A plan view showing the structure of a bonding member according to a fourth modification of the embodiment of the present invention.

While the bonding member 90 has the substantially circular shape in the plan view in the aforementioned embodiment, the present invention is not restricted to this. Specifically, it is simply required to arrange the bonding member 90 in the region that is smaller than the substrate 30 and straddles the first region R1 of the substrate 30 and the second region R2 of the substrate 30. As in a third modification shown in FIG. 11 and a fourth modification shown in FIG. 12, for example, each of bonding members 490 and 590 may have a rectangular shape in a plan view. A side portion 490a of the bonding member 490 according to the third modification shown in FIG. 11 is arranged in parallel to a longitudinal direction (X-axis direction). A side portion 590a of the bonding member 590 according to the fourth modification shown in FIG. 12 is arranged to intersect with a longitudinal direction (X-axis direction).

Figure 13:
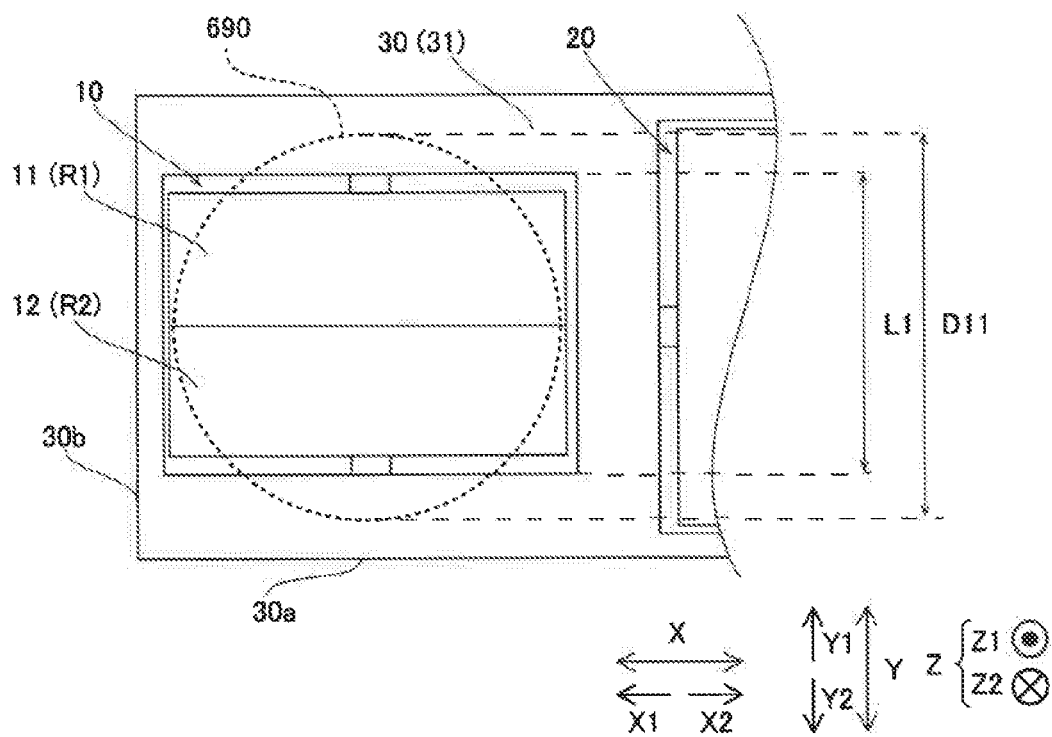
FIG. 13 A plan view showing the structure of a bonding member according to a fifth modification of the embodiment of the present invention.

While the diameter D1 of the bonding member 90 is 0.4 or more times and 1 or less times as large as the length L1 from the end 60a on the arrow Y1 direction side in the first region R1 of the substrate 30 to the end 70a on the arrow Y2 direction side in the second region R2 of the substrate 30 in the aforementioned embodiment, the present invention is not restricted to this. Specifically, as in a fifth modification shown in FIG. 13, the diameter D11 of a bonding member 690 may be larger than the length L1.

Figure 14:
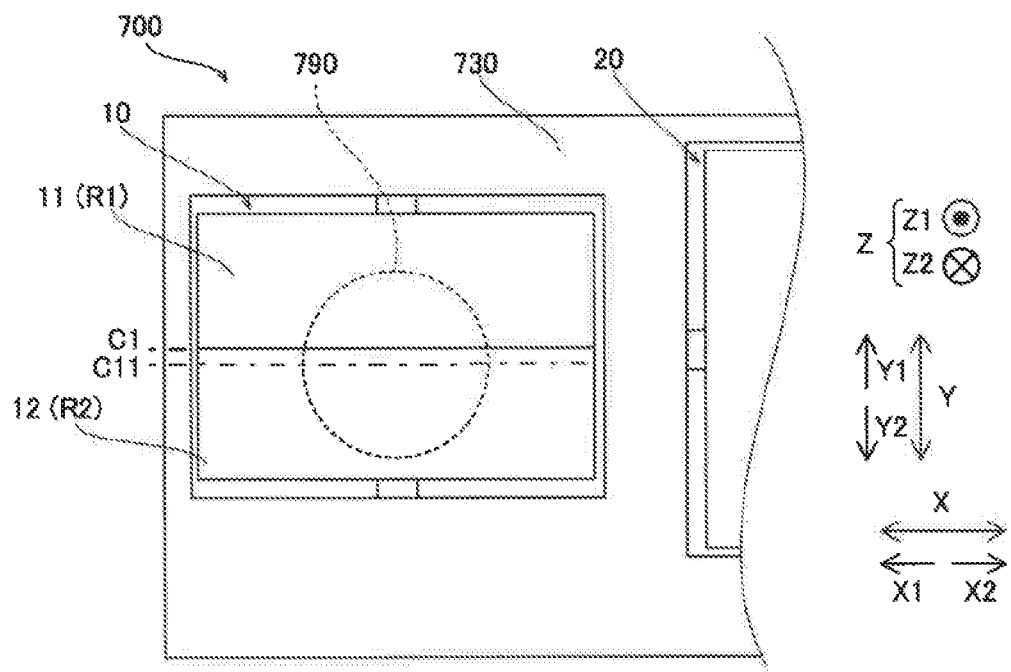
FIG. 14 A plan view showing the structure of a bonding member according to a sixth modification of the embodiment of the present invention.

While the bonding member 90 is line-symmetric about the line segment C1 in the aforementioned embodiment, the present invention is not restricted to this. As in an accelerometer 700 according to a sixth modification shown in FIG. 14, for example, a bonding member 790 may not be line-symmetric about a line segment C1 but may be line-symmetric about a line segment C11 on an arrow Y2 direction side with respect to the line segment C1 when a Y-axis sensor element 10 is arranged on a portion of a substrate 730 on an arrow Y1 direction side.

While the accelerometer 100 is configured as a two-axis accelerometer including the Y-axis sensor element 10 and the X-axis sensor element 20 in the aforementioned embodiment, the present invention is not restricted to this. For example, the accelerometer 100 may alternatively be configured as a one-axis accelerometer including the Y-axis sensor element 10 without providing the X-axis sensor element 20. As in a seventh modification shown in FIG. 15, for example, an accelerometer 800 may not be provided with an X-axis sensor element 20 but may be provided with a Y-axis sensor element 10.

While the fixed electrode fingers 65 and 75 and the movable electrode fingers 66 and 76 of the Y-axis sensor element 10 extend along the longitudinal direction of the substrate 30 in the aforementioned embodiment, the present invention is not restricted to this. Specifically, as in the seventh modification shown in FIG. 15, a Y-axis sensor element 810 of the accelerometer 800 may be provided with fixed electrode fingers 865 and 875 and movable electrode fingers 866 and 876 extend along the short-side direction of a substrate 830.

Figure 15:
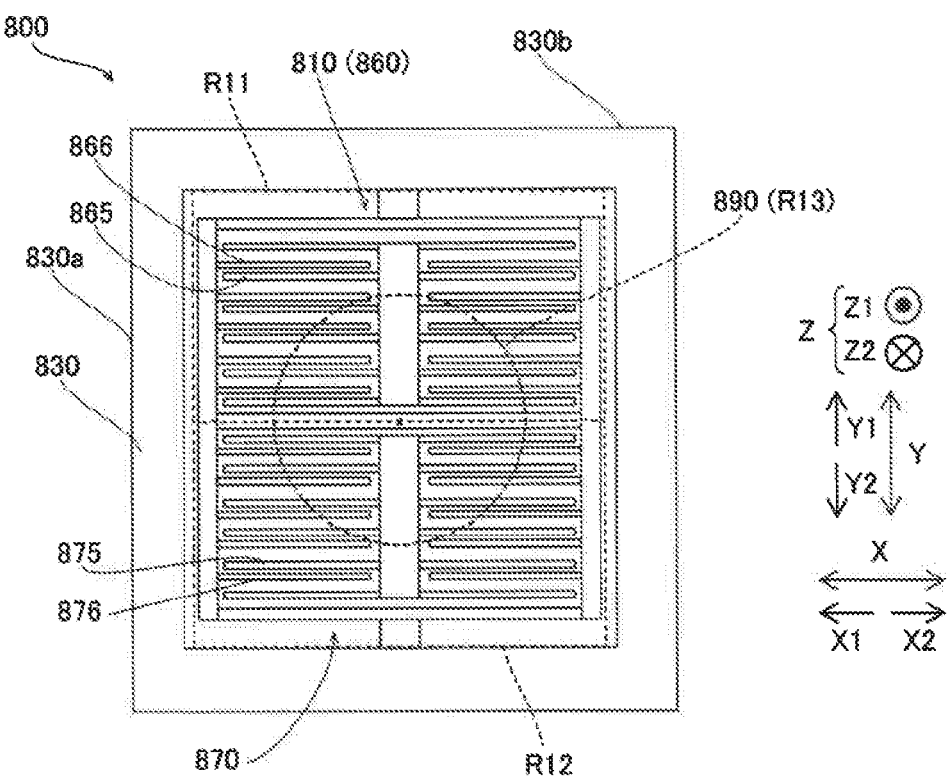
FIG. 15 A plan view showing the structure of an accelerometer according to a seventh modification of the embodiment of the present invention.

The accelerometer 800 according to the seventh modification shown in FIG. 15 is configured as a one-axis accelerometer and includes the Y-axis sensor element 810. The accelerometer 800 further includes the substrate 830 having a long side 830a in a Y-axis direction and a short side 830b in an X-axis direction and a bonding member 890. The Y-axis sensor element 810 includes a first Y-axis comb electrode 860 including the fixed electrode fingers 865 and the movable electrode fingers 866 that extend along the short-side direction (X-axis direction) of the substrate 830 and a second Y-axis comb electrode 870 including the fixed electrode fingers 875 and the movable electrode fingers 876 that extend along the short-side direction (X-axis direction) of the substrate 830. The bonding member 890 is arranged in a region R13 that straddles a region R11 in which the first Y-axis comb electrode 860 is arranged and a region R12 in which the second Y-axis comb electrode 870 is arranged as viewed from an arrow Z1 direction side.

While the accelerometer 100 is provided with the first Y-axis comb electrode 60 and the second Y-axis comb electrode 70 in the aforementioned embodiment, the present invention is not restricted to this. As in an eighth modification shown in FIGS. 16 and 17, for example, an accelerometer 900 may be provided with a first Z-axis sensor element 911 including a piezoelectric element 911a and a second Z-axis sensor element 912 including a piezoelectric element.

Figure 16:
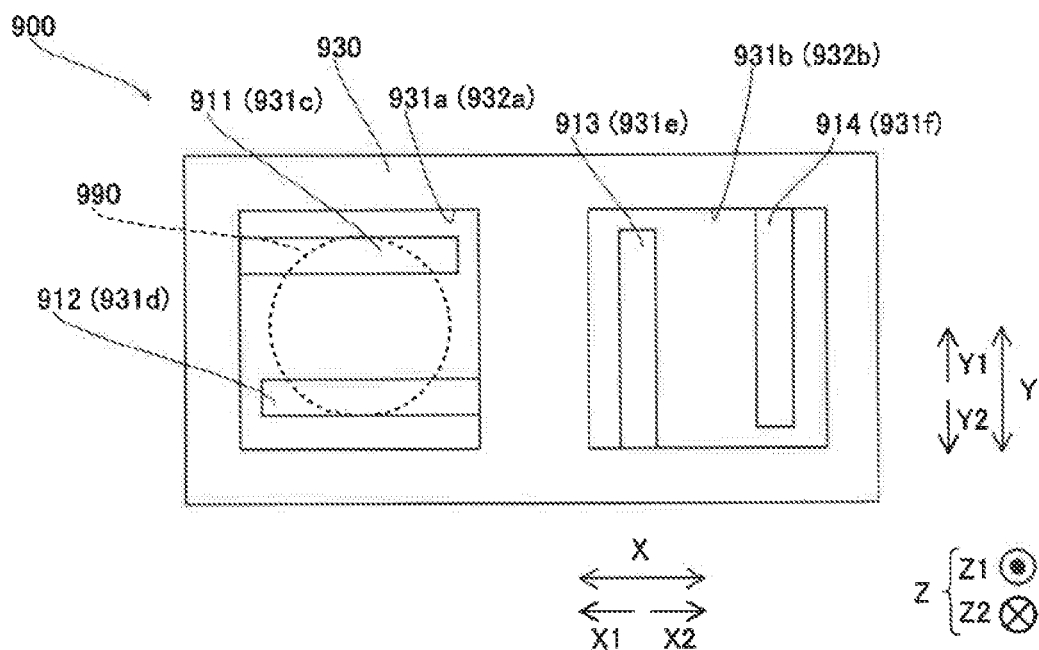
FIG. 16 A plan view showing the structure of an accelerometer according to an eighth modification of the embodiment of the present invention.
Figure 17:
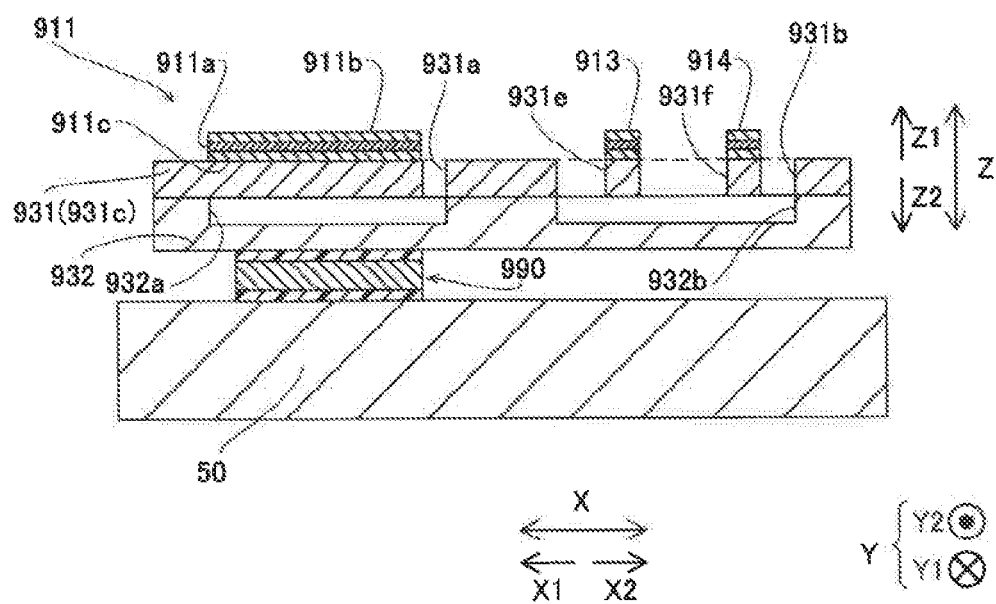
FIG. 17 A sectional view showing the structure of the accelerometer according to the eighth modification of the embodiment of the present invention.

The accelerometer 900 according to the eighth modification shown in FIGS. 16 and 17 includes the first Z-axis sensor element 911, the second Z-axis sensor element 912, a third Z-axis sensor element 913, a fourth Z-axis sensor element 914, a substrate 930, and a bonding member 990.

As shown in FIG. 17, the first Z-axis sensor element 911 is configured to be capable of detecting a Z-axis acceleration and includes the piezoelectric element 911a and electrodes 911b and 911c that extend along the longitudinal direction (X-axis direction) of the substrate 930. The substrate 930 includes a silicon layer 931 and a glass layer 932 arranged on the arrow Z2 direction side of the silicon layer 931. The glass layer 932 includes a recess 932a recessed toward the arrow Z2 direction side in a portion of the glass layer 932 on an arrow X1 direction side and a recess 932b recessed toward the arrow Z2 direction side in a portion of the glass layer 932 on an arrow X2 direction side. The silicon layer 931 includes an opening 931a at a position corresponding to the recess 932a and an opening 931b at a position corresponding to the recess 932b, as viewed from an arrow Z1 direction side. The silicon layer 931 further includes beams 931c and 931d that extend inward of the opening 931a and beams 931e and 931f that extend inward of the opening 931b.

The piezoelectric element 911a of the first Z-axis sensor element 911 is arranged on the arrow Z1 direction side of the beam 931c in a state where the piezoelectric element 911a is sandwiched between the electrodes 911b and 911c. The second Z-axis sensor element 912, the third Z-axis sensor element 913, and the fourth Z-axis sensor element 914 are arranged on the beam 931d, the beam 931e, and the beam 931f, similarly to the first Z-axis sensor element 911. The bonding member 990 is arranged in a region that straddles a region in which the first Z-axis sensor element 911 is arranged and a region in which the second Z-axis sensor element 912 is arranged as viewed from the arrow Z1 direction side.

While the control circuit 40 provides open-loop control in the aforementioned embodiment, the present invention is not restricted to this. Specifically, the control circuit 40 may alternatively provide closed-loop control.

While the substrate 30 has the rectangular shape in the aforementioned embodiment, the present invention is not restricted to this. For example, the substrate 30 may alternatively have an elliptic shape or circular shape.

While the bonding member 90 includes the pedestal 91, the first adhesion layer 92 arranged on the surface 91a of the pedestal 91 closer to the substrate 30, and the second adhesion layer 93 arranged on the surface 91b of the pedestal 91 closer to the package base 50 in the aforementioned embodiment, the present invention is not restricted to this. For example, as in an accelerometer 1000 according to a ninth modification shown in FIG. 18, a substrate 1030 and a pedestal 1091 may be integral and unitary with each other, or as in an accelerometer 1100 according to a tenth modification shown in FIG. 19, a package base 1150 and a pedestal 1191 may be integral and unitary with each other.

Figure 18:
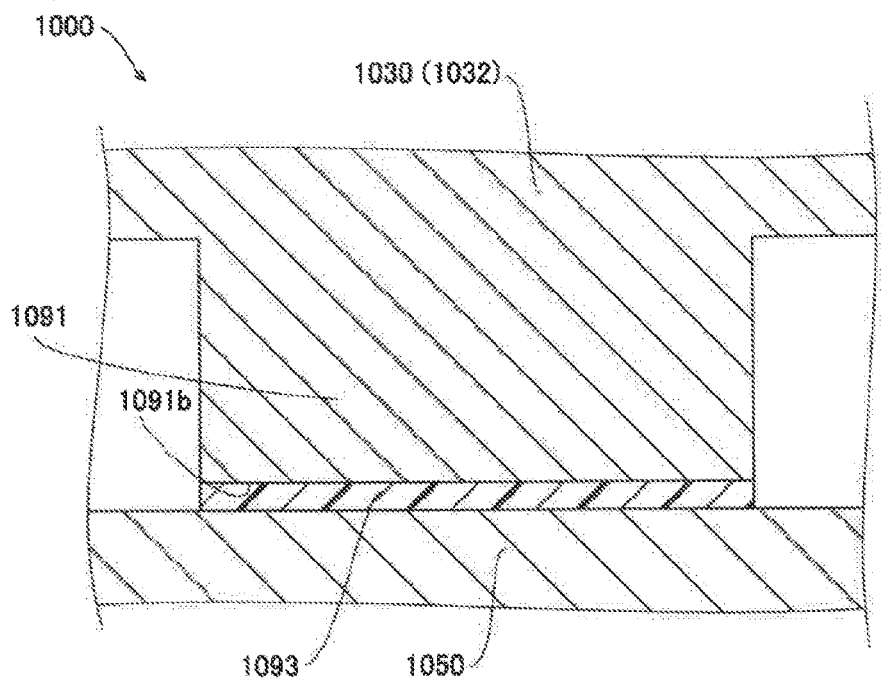
FIG. 18 A sectional view showing the structure of an accelerometer according to a ninth modification of the embodiment of the present invention.

The accelerometer 1000 according to the ninth modification shown in FIG. 18 includes the substrate 1030 integral and unitary with the pedestal 1091. Specifically, the substrate 1030 includes the pedestal 1091 that protrudes from a lower glass layer 1032 toward an arrow Z2 direction side.

More specifically, the pedestal 1091 is made of borosilicate glass. An adhesion layer 1093 is provided between a surface 1091*b* of the pedestal 1091 closer to a package base 1050 and the package base 1050.

Figure 19:
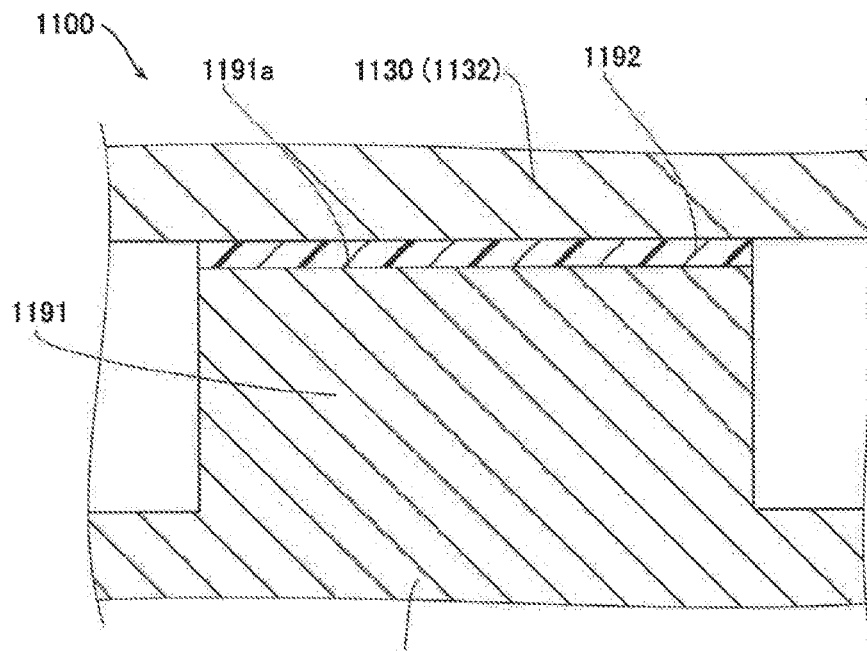
FIG. 19 A sectional view showing the structure of an accelerometer according to a tenth modification of the embodiment of the present invention.

The accelerometer 1100 according to the tenth modification shown in FIG. 19 includes the package base 1150 integral and unitary with the pedestal 1191. Specifically, the package base 1150 includes the pedestal 1191 that protrudes from the package base 1150 toward an arrow Z1 direction side. More specifically, the pedestal 1191 is made of alumina ceramic. An adhesion layer 1192 is provided between a surface 1191*a* of the pedestal 1191 closer to a substrate 1130 and the substrate 1130.

While the first Y-axis sensor element 11 and the second Y-axis sensor element 12 are arrayed in parallel to each other in the short-side direction (Y-axis direction) of the substrate 30 on the portion P1 of the substrate 30 on the first side in the longitudinal direction, as shown in FIG. 1, in the aforementioned embodiment, the present invention is not restricted to this. As in an accelerometer 1300 according to the eleventh modification shown in FIG. 22, for example, the first Y-axis sensor element 1311 and the second Y-axis sensor element 1312 may be arrayed in parallel to each other in the longitudinal direction (X-axis direction) of a substrate 1330 on a portion P21 of the substrate 1330 on a first side in the longitudinal direction.

The accelerometer 1300 according to the eleventh modification shown in FIG. 22 includes a Y-axis sensor element 1310 including the first Y-axis sensor element 1311 and the second Y-axis sensor element 1312 and an X-axis sensor element 1320. The first Y-axis sensor element 1311 includes the fixed electrode fingers 1365 and the movable electrode fingers 1366 that extend along the longitudinal direction. The second Y-axis sensor element 1312 includes the fixed electrode fingers 1375 and the movable electrode fingers 1376 that extend along the longitudinal direction.

The first Y-axis sensor element 1311 has the detection axis C101. The second Y-axis sensor element 1312 has the detection axis C102 provided on a second side (arrow X2 direction side) in the longitudinal direction with respect to the detection axis C101. A bonding member 1390 is provided in a region (restraint region) R200 that straddles a region in which the first Y-axis sensor element 1311 is arranged and a region in which the second Y-axis sensor element 1312 is arranged. The first Y-axis sensor element 1311 and the second Y-axis sensor element 1312 are arranged on the portion P21 of the substrate 1330 on the first side in the longitudinal direction, and the X-axis sensor element 1320 is arranged on a portion P22 of the substrate 1330 on the second side in the longitudinal direction.

DESCRIPTION OF REFERENCE NUMERALS

11, 1311 First Y-axis sensor element (first sensor element)
12, 1312 Second Y-axis sensor element (second sensor element)
20, 1320 X-axis sensor element (third sensor element)
30, 730, 830, 930, 1030, 1130, 1330 Substrate
50, 1050, 1150 Package base (supporting member)
60, 860 First Y-axis comb electrode (first comb electrode)
61 Fixed electrode body (first fixed part)
63 Support (first fixed part)
65, 75, 865, 875, 1365, 1375 Fixed electrode finger (first fixed electrode finger)
66, 76, 866, 876, 1366, 1376 Movable electrode finger (first movable electrode finger)
70, 870 Second Y-axis comb electrode (first comb electrode)
71 Fixed electrode body (second fixed part)
73 Support (second fixed part)
80*a* First X-axis comb electrode (second comb electrode)
80*b* Second X-axis comb electrode (second comb electrode)
85*a*, 85*b* Fixed electrode finger (second fixed electrode finger)
86*a*, 86*b* Movable electrode finger (second movable electrode finger)
90, 390, 490, 590, 690, 790, 990, 1390 Bonding member
91, 1091, 1191 Pedestal
91*a*, 1191*a* Surface (surface of the pedestal closer to the substrate)
91*b*, 1091*b* Surface (surface of the pedestal closer to the supporting member)
92 First adhesion layer (adhesion layer)
93 Second adhesion layer (adhesion layer)
100, 700, 800, 900, 1000, 1100, 1300 Accelerometer (sensor)
200 Inertial sensor (sensor)
911 First Z-axis sensor element (first sensor element)
912 Second Z-axis sensor element (second sensor element)
1093, 1192 Adhesion layer

The invention claimed is:

1. A sensor that outputs a differential value between a value detected by a first sensor element and a value detected by a second sensor element provided separately from the first sensor element, comprising:
a substrate on which the first sensor element and the second sensor element are arranged;
a supporting member that supports the substrate; and
a bonding member that is provided between the substrate and the supporting member and bonds the substrate and the supporting member to each other, wherein
the bonding member is arranged in a region that is smaller than the substrate and straddles a first region of the substrate in which the first sensor element is arranged and a second region of the substrate in which the second sensor element is arranged in a plan view,
the first sensor element and the second sensor element are arranged in a portion of the substrate on a first side in a longitudinal direction, the portion of the substrate on the first side in the longitudinal direction and the supporting member are bonded to each other through the bonding member, and a portion of the substrate on a second side in the longitudinal direction and the supporting member are spaced apart from each other without the bonding member,
the first sensor element and the second sensor element are configured as a MEMS, and each include a first comb electrode having a first fixed electrode finger and a first movable electrode finger,
the sensor further comprises a third sensor element including a second comb electrode having a second fixed electrode finger and a second movable electrode finger, arranged in the portion of the substrate on the second side in the longitudinal direction,
the first fixed electrode finger and the first movable electrode finger of the first comb electrode extend along the longitudinal direction of the substrate, and
the second fixed electrode finger and the second movable electrode finger of the second comb electrode extend along a short-side direction of the substrate.

2. The sensor according to claim 1, wherein the bonding member has a substantially circular shape in a plan view.

3. The sensor according to claim 1, wherein the bonding member is line-symmetric about a line segment that passes through an intermediate point between the first region and the second region and is orthogonal to a direction in which the first sensor element and the second sensor element are arrayed in a plan view.

4. The sensor according to claim 1, wherein
the first sensor element includes a first fixed part to secure the first sensor element to the substrate,
the second sensor element includes a second fixed part to secure the second sensor element to the substrate, and the second fixed part is line-symmetric with the first fixed part about a line segment that passes through an intermediate point between the first region and the second region and is orthogonal to a direction in which the first sensor element and the second sensor element are arrayed in a plan view, and
the bonding member is arranged in a region that includes an intermediate point between the first fixed part and the second fixed part and straddles the first region and the second region in a plan view.

5. The sensor according to claim 1, wherein the first sensor element and the second sensor element are arrayed in parallel to each other in the short-side direction of the substrate in the portion of the substrate on the first side in the longitudinal direction.

6. The sensor according to claim 1, wherein the bonding member includes a pedestal, a first adhesion layer arranged on a surface of the pedestal closer to the substrate, and a second adhesion layer arranged on a surface of the pedestal closer to the supporting member.

7. The sensor according to claim 6, wherein a thickness of the first adhesion layer and the second adhesion layer is less than a thickness of the pedestal.

8. The sensor according to claim 6, wherein the first adhesion layer and the second adhesion layer include one of an epoxy resin having a viscosity of not more than 30 Pa·s and an acrylic resin having a viscosity of not more than 30 Pa·s.

9. The sensor according to claim 6, wherein the pedestal includes a material that is the same as a constituent material of the substrate.

* * * * *